(12) United States Patent
Sawada et al.

(10) Patent No.: US 12,224,742 B2
(45) Date of Patent: Feb. 11, 2025

(54) SWITCH DEVICE

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Ryohei Sawada, Yokkaichi (JP); Masaya Ina, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 18/259,653

(22) PCT Filed: Dec. 23, 2021

(86) PCT No.: PCT/JP2021/047957
§ 371 (c)(1),
(2) Date: Jun. 28, 2023

(87) PCT Pub. No.: WO2022/149483
PCT Pub. Date: Jul. 14, 2022

(65) Prior Publication Data
US 2024/0322818 A1 Sep. 26, 2024

(30) Foreign Application Priority Data
Jan. 8, 2021 (JP) .................................. 2021-002279

(51) Int. Cl.
*H03K 17/687* (2006.01)

(52) U.S. Cl.
CPC .............................. *H03K 17/6871* (2013.01)

(58) Field of Classification Search
None
See application file for complete search history.

(56) References Cited

U.S. PATENT DOCUMENTS

| 11,973,420 B2* | 4/2024 | Nagano | G06F 1/305 |
| 2019/0214982 A1 | 7/2019 | Kato | |
| 2023/0123793 A1* | 4/2023 | Sawada | H02H 9/025 |
| | | | 320/135 |

FOREIGN PATENT DOCUMENTS

| JP | 2015-101184 A | 6/2015 |
| JP | 2019-201391 A | 11/2019 |

OTHER PUBLICATIONS

International Search Report, Application No. PCT/JP2021/047957, mailed Feb. 1, 2022. ISA/Japan Patent Office.

* cited by examiner

*Primary Examiner* — Cassandra F Cox
(74) *Attorney, Agent, or Firm* — Honigman LLP

(57) ABSTRACT

In a switch device, an output voltage output by a microcomputer is input to one end of a resistor. A driving circuit switches a main switch on or off according to a resistor voltage at the other end of the resistor. When all of a plurality of specific voltages included in a plurality of output voltages output by the microcomputer are an output threshold or more, an AND circuit of an adjustment circuit reduces the resistor voltage.

8 Claims, 11 Drawing Sheets

Example in which reference potential difference increases

SWITCH DEVICE

CROSS-REFERENCE TO RELATED APPLICATIONS

This application is the U.S. national stage of PCT/JP2021/047957 filed on Dec. 23, 2021, which claims priority of Japanese Patent Application No. JP 2021-002279 filed on Jan. 8, 2021, the contents of which are incorporated herein.

TECHNICAL FIELD

The present disclosure relates to a switch device.

BACKGROUND

In JP 2015-101184A, a switch device for vehicles that controls power feeding from a power supply to a load is disclosed. In this switch device, a switch is connected between the power supply and the load. The power feeding from the power supply to the load is controlled by switching the switch on or off.

The switch is switched on or off by a switching circuit. A voltage is input to the switching circuit from an output unit. The switching circuit switches the switch on or off according to an input voltage received from the output unit.

In the power feeding control device described in JP 2015-101184A, switching of the switch when the output unit outputs an erroneous voltage to the switching circuit is not considered.

Therefore, the present disclosure aims to provide a switch device that can appropriately switch a switch when an output unit outputs an erroneous voltage.

SUMMARY

A switch device according to one aspect of the present disclosure includes: an output unit configured to output a plurality of voltages; a switch; a resistor whose one end receives one output voltage output by the output unit; a switching circuit configured to switch the switch on or off according to a resistor voltage at the other end of the resistor; and a reduction circuit configured to, when all of a plurality of specific voltages included in the plurality of output voltages output by the output unit are an output threshold or more, reduce the resistor voltage.

Advantageous Effects

According to the present disclosure, a switch is appropriately switched when an output unit outputs an erroneous voltage.

DETAILED DESCRIPTION OF PREFERRED EMBODIMENTS

Figure 1:
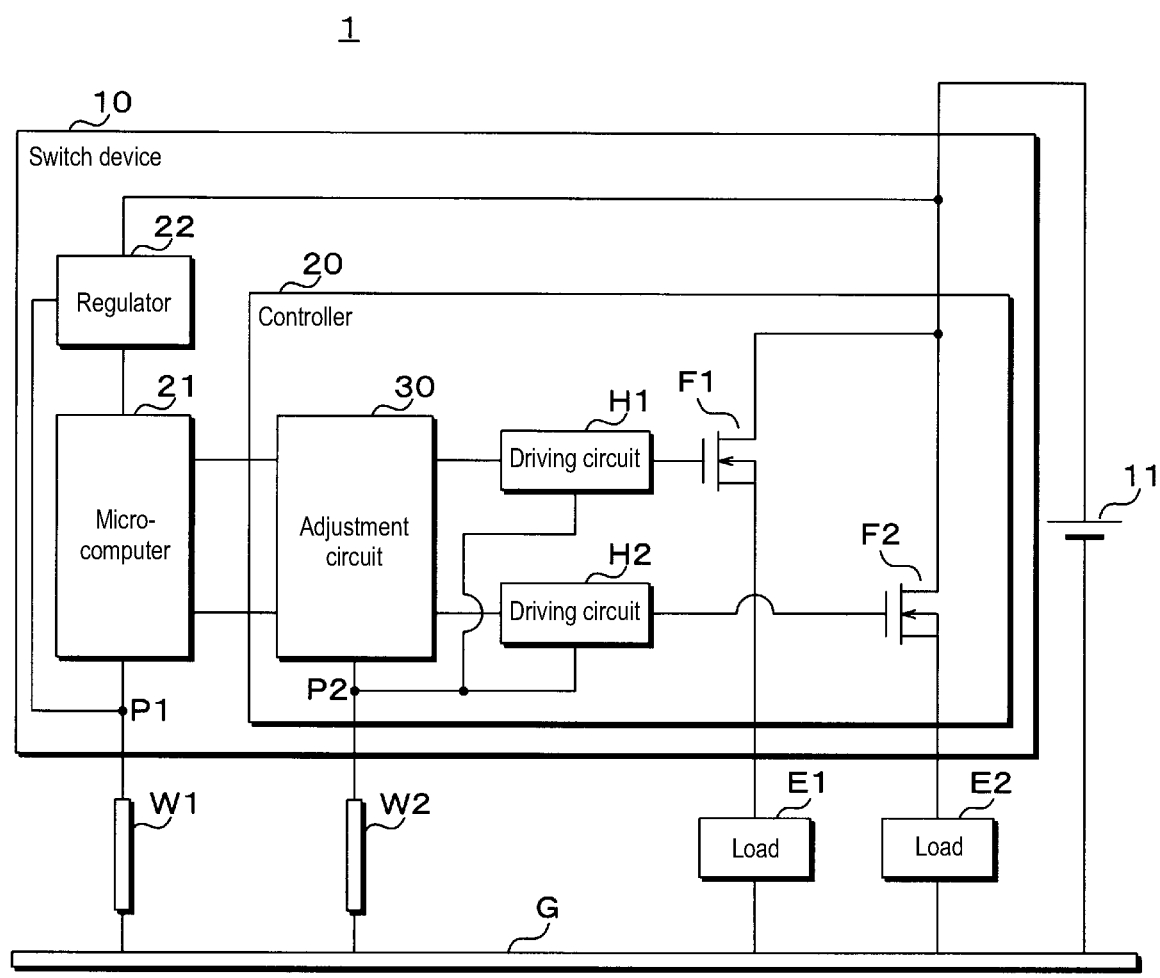
FIG. 1 is a block diagram illustrating the main configuration of a power supply system in Embodiment 1.

First, modes for carrying out the disclosure will be enumerated and described. At least some of the modes described below may be combined as necessary.

A switch device according to one aspect of the present disclosure includes: an output unit configured to output a plurality of voltages; a switch; a resistor whose one end receives one output voltage output by the output unit; a switching circuit configured to switch the switch on or off according to a resistor voltage at the other end of the resistor; and a reduction circuit configured to, when all of a plurality of specific voltages included in the plurality of output voltages output by the output unit are an output threshold or more, reduce the resistor voltage.

In the aspect above, normally, the plurality of specific voltages output by the output unit will not increase to the output threshold or more at the same time. When the plurality of specific voltages have increased to the output threshold or more at the same time, it is determined that the output unit output an erroneous output voltage, and the resistor voltage is reduced. Accordingly, the switch is switched to a state entered when the resistor voltage is low. Therefore, the switch can be appropriately switched.

In the switch device according to one aspect of the present disclosure, the switching circuit, when the resistor voltage has increased to a resistor threshold or more, switches the switch on, and when the resistor voltage has decreased below the resistor threshold, switches the switch off, and when all of the plurality of specific voltages are the output threshold or more, the reduction circuit reduces the resistor voltage below the resistor threshold.

In the aspect above, when all of the specific voltages are output threshold or more, the switch is switched off.

In the switch device according to one aspect of the present disclosure, the output threshold is less than the resistor threshold.

In the aspect above, the output threshold is less than the resistor threshold. Therefore, when the output unit has output an erroneous output voltage, the resistor voltage can be reduced before the resistor voltage increases to the resistor threshold or more. As a result, the resistor voltage can be reduced before the switch is switched on.

In the switch device according to one aspect of the present disclosure, a current flows through a resistor member having a resistance component and a conductor in this order, the output unit adjusts the plurality of output voltages relative to a first potential at one end of the resistor member on an upstream side, the switching circuit switches the switch on or off according to the resistor voltage relative to a second potential at a place different from the one end of the resistor member on the upstream side, and the reduction circuit reduces the resistor voltage when all of the plurality of specific voltages relative to the second potential are the output threshold or more.

In the aspect above, when the potential difference obtained by subtracting the second potential from the first potential exceeds 0 V, an output voltage (specific voltage) relative to the second potential is higher than an output voltage (specific voltage) relative to the first potential by the potential difference. When the potential difference is the output threshold or more, all specific voltages are the output threshold or more, irrelevant to the adjustment of the output voltages performed by the output unit.

The switch device according to one aspect of the present disclosure further includes a second switch whose one end is connected to the other end of the resistor. When the second switch is on, a current flows through the resistor, the second switch, and the conductor in this order, and the reduction circuit, when all of the plurality of specific voltages are the output threshold or more, switches the second switch on.

In the aspect above, the resistor voltage is reduced by switching the second switch on.

In the switch device according to one aspect of the present disclosure, the output voltage output by the output unit to the one end of the resistor is one of the plurality of specific voltages.

In the aspect above, the output voltage output to the one end of the resistor is used as one specific voltage.

In the switch device according to one aspect of the present disclosure, the output voltage output by the output unit to the one end of the resistor is different from the plurality of specific voltages.

In the aspect above, whether or not the resistor voltage is reduced is determined based on a plurality of specific voltages included in a plurality of output voltages that differ from the output voltage output to the one end of the resistor.

The switch device according to one aspect of the present disclosure further includes a first circuit board; and a second circuit board different from the first circuit board. The output unit is disposed on the first circuit board, and the switch, the resistor, the switching circuit, and the reduction circuit are disposed on the second circuit board.

In the aspect above, the output unit is disposed on the first circuit board. The switch, the resistor, the switching circuit, and the reduction circuit are disposed on the second circuit board.

Specific examples of a power supply system according to embodiments of the present disclosure will be described below with reference to the drawings. Note that the present disclosure is not limited to these illustrative examples and is defined by the claims, and all changes that come within the meaning and range of equivalency of the claims are intended to be embraced therein.

Embodiment 1

Configuration of Power Supply System

FIG. 1 is a block diagram illustrating the main configuration of a power supply system 1 in Embodiment 1. The power supply system 1 is installed in a vehicle. The power supply system 1 includes a switch device 10, a DC power supply 11, two loads E1 and E2, and a conductor G. The DC power supply 11 is a battery, for example. The conductor G is a vehicle body, for example.

Any integer is represented by i below. The integer i may be one or two. The switch device 10 includes two main switches F1 and F2. The main switches Fi are N-channel FETs (field effect transistors). When the main switches Fi are on, the resistance between their drain and source is sufficiently small. Therefore, current can flow through the drain and source of the main switches Fi. When the main switches Fi are off, the resistance between their drain and source is sufficiently large. Therefore, current will not flow through the drain and source of the main switches Fi.

A positive electrode of the DC power supply 11 is connected to the drains of the main switches Fi. The source of each main switch Fi is connected to one end of the corresponding load Ei. A negative electrode of the DC power supply 11 and the other ends of the loads E1 and E2 are connected to a conductor G. Grounding is realized by the connection to the conductor G. The switch device 10 is connected to one end of each of a first conducting wire W1 and a second conducting wire W2. The other ends of the first conducting wire W1 and second conducting wire W2 are connected to the conductor G. The first conducting wire W1 and the second conducting wire W2 are connected to different positions of the conductor G.

When a main switch Fi is switched on, a current flows from the positive electrode of the DC power supply 11 to that main switch Fi and the load Ei in that order. Accordingly, power is supplied to that load Ei. When a main switch Fi is switched off, power supply to that load Ei stops. The loads Ei are electric devices. When power is supplied to a load Ei, the load Ei starts operating. When power supply to the load Ei stops, the load Ei stops operating. The switch device 10 controls operations of the loads Ei by switching the main switches Fi on or off.

There is no situation in which the two loads E1 and E2 need to operate simultaneously. Therefore, there is no situation in which the switch device 10 needs to switch the two main switches F1 and F2 on at the same time. For example, the load E1 is a high-beam light for illuminating a forward area of a vehicle. The load E2 is a low-beam light for illuminating a forward and downward area of the vehicle.

Configuration of Switch Device 10

The switch device 10 includes a controller 20, microcomputer 21, and a regulator 22. The controller 20 includes an adjustment circuit 30, two main switches F1 and F2, and two driving circuits H1 and H2. In the controller 20, the gates of the main switches Fi are connected to the driving circuits Hi. The driving circuits Hi are separately connected to the microcomputer 21 via the adjustment circuit 30. The driving circuits Hi and the adjustment circuit 30 are connected to the one end of the second conducting wire W2. As described above, the other end of the second conducting wire W2 is connected to the conductor G.

The microcomputer 21 is also connected to the regulator 22 and the one end of the first conducting wire W1. As described above, the other end of the first conducting wire W1 is connected to the conductor G. The regulator 22 is also connected to the drains of the main switches Fi and the one end of the first conducting wire W1.

The potential at the one end of the first conducting wire W1 is denoted as "first potential P1" below. The potential at the one end of the second conducting wire W2 is denoted as "second potential P2". The voltage at the positive electrode of the DC power supply 11 is denoted as "power supply voltage".

Current flows from the positive electrode of the DC power supply 11 to the regulator 22, the first conducting wire W1, and the conductor G in that order. With this, power is supplied to the regulator 22. The regulator 22 steps down the power supply voltage relative to the first potential P1 (the first potential P1 being the reference potential) to a fixed voltage, and applies the stepped-down voltage to the microcomputer 21. Accordingly, a current flows from the positive electrode of the DC power supply 11 to the regulator 22, the microcomputer 21, the first conducting wire W1, and the conductor G in that order. With this, power is supplied to the microcomputer 21. Current flows through the first conducting wire W1 from the one end to the other end, and therefore the first potential P1 is a potential at the one end of the first conducting wire W1 on an upstream side.

The microcomputer 21 outputs an output voltage for the driving circuit Hi. Therefore, the microcomputer 21 outputs two output voltages. The microcomputer 21 functions as an output unit. The microcomputer 21 adjusts the output voltages for the driving circuits Hi relative to the first potential P1 to a high-level voltage or a low-level voltage. The high-level voltage and the low-level voltage are fixed voltages. The high-level voltage is larger than the low-level voltage. The low-level voltage is 0 V. The high-level voltage is 5 V, for example.

The adjustment circuit 30 adjusts an input voltage that is input to the driving circuits Hi based on the output voltage for the driving circuit Hi. If the input voltage relative to the second potential P2 is an input threshold or more, the driving circuits Hi switch the main switches Fi on. If the input voltage relative to the second potential P2 is less than the input threshold, the driving circuit Hi switches the main switches Fi off. The input threshold is a fixed voltage and exceeds 0 V. The driving circuits Hi function as a switching circuit.

If the gate voltage relative to the source potential is a fixed voltage or more in the main switches Fi, the main switches Fi are on. If the gate voltage relative to the source potential is less than the fixed voltage in the main switches Fi, the main switches Fi are off.

When switching the main switches Fi on, the driving circuits Hi increase their gate voltage relative to the second potential P2. With this, in a given main switch Fi, the gate voltage relative to the source potential increases to the fixed voltage or more. As a result, the corresponding main switch Fi is switched on. When switching the main switch Fi off, the driving circuit Hi decreases the gate voltage relative to the second potential P2. With this, in the main switch Fi, the gate voltage relative to the source potential decreases below the fixed voltage. As a result, the main switch Fi is switched off.

As described above, the driving circuits Hi switch the main switches Fi on or off by adjusting the gate voltages relative to the second potential P2.

The adjustment circuit 30 compares an output voltage of the microcomputer 21 relative to the second potential P2 with an output threshold. The output threshold is a fixed value, and exceeds 0 V. The output threshold is less than or equal to the input threshold. If at least one of the two output voltages output by the microcomputer 21 is less than the output threshold, the adjustment circuit 30 adjusts the input voltage of the driving circuits Hi to the output voltage for the driving circuits Hi relative to the second potential P2. If both of the two output voltages output by the microcomputer 21 are the output threshold or more, the adjustment circuit 30 reduces the input voltages of the two driving circuits H1 and H2 to 0 V. The two output voltages output by the microcomputer 21 correspond to two specific voltages.

The first conducting wire W1 and the second conducting wire W2 are resistor members having a resistance component. Therefore, when a current flows through the first conducting wire W1 from one end thereof on the microcomputer 21 side toward the conductor G, the first potential P1 increases relative to the potential of the conductor G. The amount of increase increases as the current flowing through the first conducting wire W1 increases. Similarly, when a current flows through the second conducting wire W2 from one end thereof on the adjustment circuit 30 side toward the conductor G, the second potential P2 increases relative to the potential of the conductor G. The amount of increase increases as the current flowing through the second conducting wire W2 increases.

The potential difference obtained by subtracting the second potential from the first potential is denoted as "reference potential difference" below. When the reference potential difference exceeds 0 V, the output voltage for the driving circuit Hi relative to the second potential P2 is larger than the output voltage for the driving circuit Hi relative to the first potential P1 by the reference potential difference.

As described above, the output threshold is less than or equal to the input threshold. The high-level voltage is more than or equal to the input threshold. The low-level voltage is 0 V, and is less than the output threshold. First, the operations of the switch device 10 when the reference potential difference is 0 V or more and is less than the output threshold will be described. When the output voltage for the driving circuits Hi relative to the first potential P1 is adjusted to the high-level voltage, the output voltage for the driving circuits Hi relative to the second potential P2 is the output threshold or more. When the output voltage for the driving circuits Hi relative to the first potential P1 is adjusted to the low-level voltage, the output voltage for the driving circuits Hi relative to the second potential P2 is less than the output threshold.

The microcomputer 21 will not adjust the two output voltages relative to the first potential P1 to the high-level voltage at the same time. Therefore, the adjustment circuit 30 adjusts the input voltage of the driving circuit Hi to the output voltage for the driving circuit Hi relative to the second potential P2. When the microcomputer 21 adjusts the output voltage relative to the first potential P1 to the high-level voltage, the corresponding driving circuit Hi switches the main switch Fi on. When the microcomputer 21 adjusts the output voltage relative to the first potential P1 to the low-level voltage, the corresponding driving circuit Hi switches the main switch Fi off.

Therefore, when the reference potential difference exceeds 0 V, and is less than the output threshold, the microcomputer 21 switches the main switch Fi on or off, by adjusting the output voltage for the driving circuit Hi relative to the first potential P1 to the high-level voltage or the low-level voltage.

Next, the operations of the switch device 10 when the reference potential difference is the output threshold or more will be described. When the output voltage for the driving circuit Hi relative to the first potential P1 is adjusted to the high-level voltage, the output voltage for the driving circuit Hi relative to the second potential P2 is the output threshold or more. When the output voltage for the driving circuit Hi relative to the first potential P1 is adjusted to the low-level voltage as well, the output voltage for the driving circuit Hi relative to the second potential P2 is the output threshold or more.

Therefore, when the reference potential difference is the output threshold or more, both of the two output voltages output by the microcomputer 21 are the output threshold or more. In this case, the adjustment circuit 30 reduces the input voltages of the two driving circuits H1 and H2 to 0 V. The input threshold exceeds 0 V, as described above. Therefore, when the adjustment circuit 30 reduces the input voltages of the two driving circuits Hi and H2 to 0 V, the driving circuits Hi and H2 switch the main switches F1 and F2 off.

As described above, when the microcomputer 21 erroneously outputs two output voltages that are the output threshold or more, the adjustment circuit 30 reduces the input voltages of the two driving circuits Hi and H2 to 0 V. As a result, the driving circuits H1 and H2 switch the main switches F1 and F2 off.

External Appearance of Switch Device 10

Figure 2:
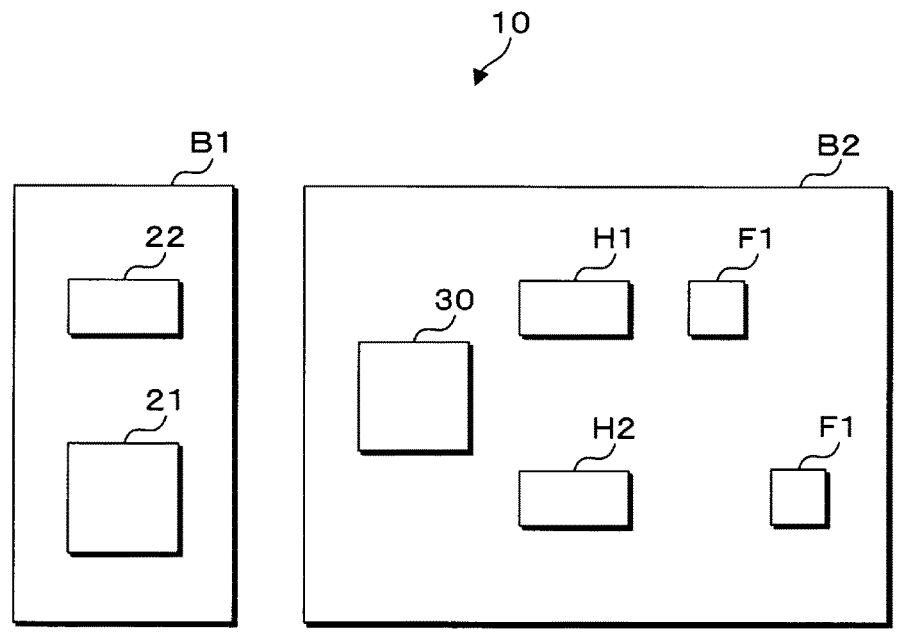
FIG. 2 is a plan view of a switch device.

FIG. 2 is a plan view of the switch device 10. The switch device 10 further includes a first circuit board B1 and a second circuit board B2. The second circuit board B2 is different from the first circuit board B1. The microcomputer 21 and the regulator 22 are disposed on the first circuit board B1. The microcomputer 21 is an integrated circuit chip, for example. The adjustment circuit 30, the two main switches F1 and F2, and the two driving circuits H1 and H2 are disposed on the second circuit board B2. Specifically, in each of the adjustment circuit 30 and the driving circuits H1 and H2, one or more circuit elements that constitute a circuit are disposed. Therefore, the controller 20 is realized with the second circuit board B2. The first circuit board B1 and the conductor G are connected by the first conducting wire W1. The second circuit board B2 and the conductor G are connected by the second conducting wire W2.

Note that a configuration may also be adopted in which the microcomputer 21, the regulator 22, the adjustment circuit 30, the two main switches F1 and F2, and the two driving circuits H1 and H2 are disposed on one circuit board.

Configuration of Adjustment Circuit 30

Figure 3:
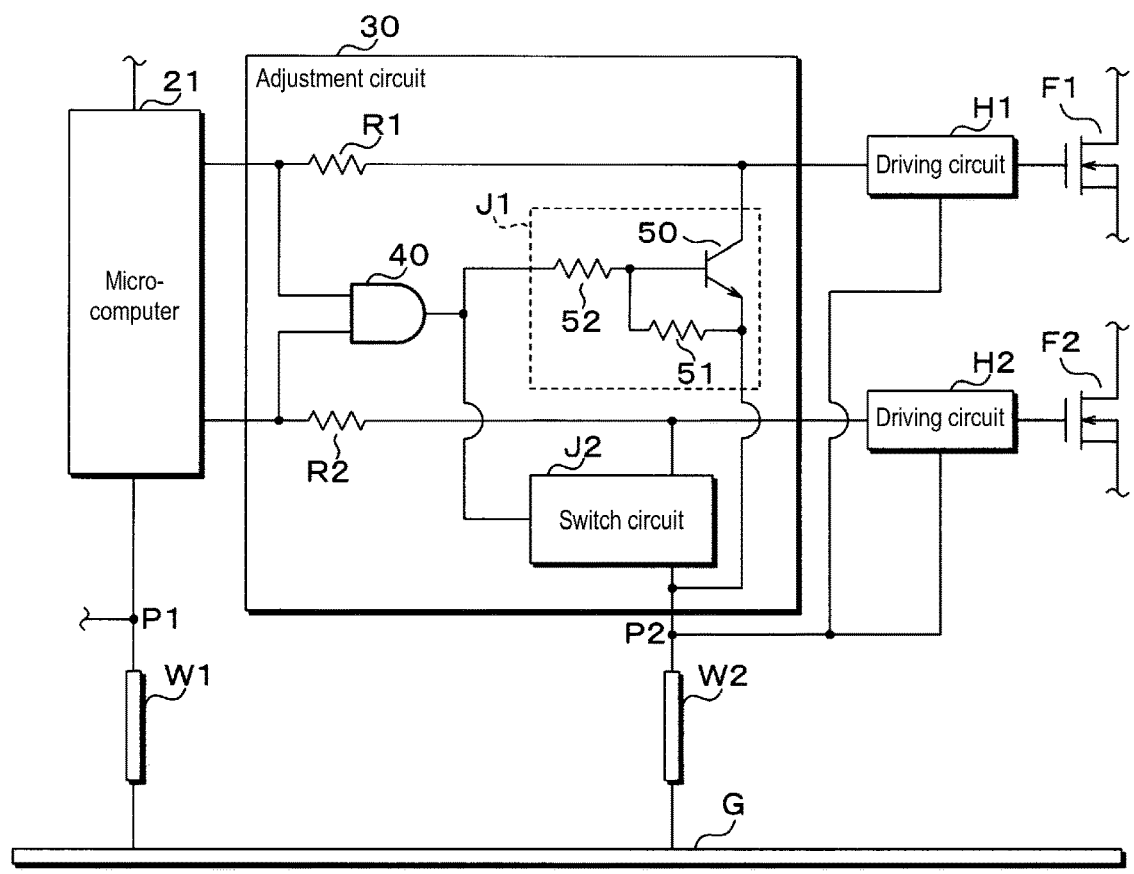
FIG. 3 is a circuit diagram of an adjustment circuit.

FIG. 3 is a circuit diagram of the adjustment circuit 30. The adjustment circuit 30 includes an AND circuit 40, two switch circuits J1 and J2, and two connection resistors R1 and R2. The AND circuit 40 has two input ends and an output end. The connection resistors Ri are connected between the microcomputer 21 and the driving circuits Hi. The connection nodes between the microcomputer 21 and the connection resistors Ri are connected to the input ends of the AND circuit 40, respectively. Therefore, the two input ends of the AND circuit 40 are separately connected to the microcomputer 21. The switch circuit Ji is connected to a connection node between the driving circuit Hi and the connection resistor Ri, the output end of the AND circuit 40, and the one end of the second conducting wire W2.

The switch circuit Ji includes a subswitch 50 and circuit resistors 51 and 52. In FIG. 3, the configuration of the switch circuit J1 is shown representatively. The subswitch 50 is an NPN bipolar transistor. When the subswitch 50 is on, the resistance between a collector and an emitter is sufficiently small. Therefore, a current can flow through the collector and the emitter. When the subswitch 50 is off, the resistance between the collector and the emitter is sufficiently large. Therefore, no current will flow through the collector and the emitter.

In the switch circuit Ji, the collector of the subswitch 50 is connected to one end of the connection resistor Ri on the driving circuit Hi side. The subswitch 50 functions as a second switch. The emitter of the subswitch 50 is connected to the one end of the second conducting wire W2. The circuit resistor 51 is connected between a base and the emitter of the subswitch 50. One end of the circuit resistor 52 is connected to the base of the subswitch 50. The other end of the circuit resistor 52 is connected to the output end of the AND circuit 40.

The output voltage for the driving circuit Hi output by the microcomputer 21 is input to the one end of the connection resistor Ri. The voltage at the one end of the connection resistor Ri on the driving circuit Hi side is input to the driving circuit Hi as the input voltage. The input voltage and the input threshold respectively correspond to a resistor voltage and a resistor threshold. As described above, the driving circuit Hi switches the main switch Fi on or off according to the input voltage.

Regarding the subswitch 50 of the switch circuit Ji, when the base voltage relative to the emitter potential is less than a fixed voltage, the subswitch 50 is off. The fixed voltage is a positive voltage. When the subswitch 50 is off, no current will flow through the connection resistor Ri. Therefore, the output voltage for the driving circuit Hi relative to the second potential P2 is input to the driving circuit Hi as an input voltage. The driving circuit Hi monitors the input voltage relative to the second potential P2.

Regarding the subswitch 50 of the switch circuit Ji, when the base voltage relative to the emitter potential is the fixed voltage or more, the subswitch 50 is on. When the subswitch 50 is on, the input voltage relative to the second potential P2 is reduced to 0 V. When the input voltage is 0 V, the input voltage is less than the input threshold. Therefore, the driving circuit Hi switches the main switch Fi off.

When the output voltage for the driving circuit Hi relative to the second potential exceeds 0 V, if the subswitch 50 is on, a current flows through the connection resistor Ri, the subswitch 50, and the conductor G in that order.

The AND circuit 40 compares the output voltage for the driving circuit Hi relative to the second potential P2 with the output threshold. If at least one of the two output voltages is less than the output threshold, the AND circuit 40 adjusts the voltage at the output end relative to the second potential P2 to 0 V. In this case, no current will flow through the circuit resistor 51, in the switch circuit Ji. Therefore, regarding the subswitch 50, the base voltage relative to the emitter potential, is 0 V, and is less than the fixed voltage. As a result, the subswitch 50 is off.

If both of the two output voltages are the output threshold or more, the AND circuit 40 adjusts the voltage at the output end relative to the second potential P2 to a positive predetermined voltage. In this case, a current flows through the circuit resistors 52 and 51, the second conducting wire W2, and the conductor G in that order. Accordingly, a voltage drop occurs in the circuit resistor 51, and therefore the base voltage relative to the emitter potential, is the fixed voltage or more, in the subswitch 50. As a result, the subswitch 50 is on. When the AND circuit 40 switches on the subswitches 50 of the switch circuits J1 and J2, the input voltages of the driving circuits H1 and H2 relative to the second potential P2 decrease to 0 V. The AND circuit 40 functions as a reduction circuit.

Operations of Adjustment Circuit 30

Figure 4:
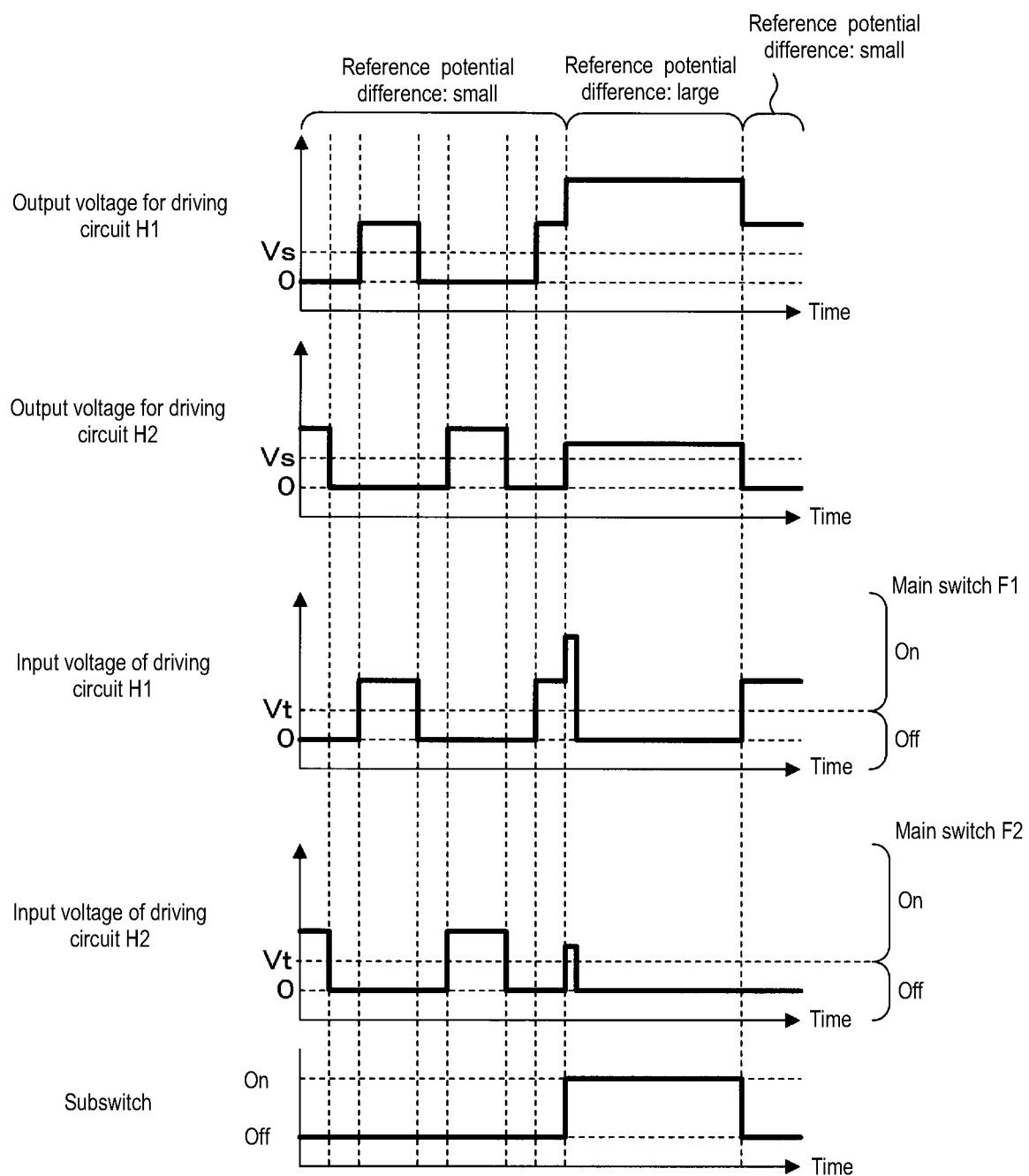
FIG. 4 is a timing chart illustrating operations of the adjustment circuit.

FIG. 4 is a timing chart for illustrating operations of the adjustment circuit 30. In FIG. 4, changes in the output voltage for the driving circuits Hi, changes in the input voltage of the driving circuits Hi, and state transitions of the subswitches 50 for the driving circuits H1 and H2 are shown. The states of the subswitches 50 for the driving circuits H1 and H2 are always the same. In FIG. 4, the output threshold and the input threshold are respectively denoted as Vs and Vt. In FIG. 4, the two output voltages and the two input voltages, relative to the second potential P2, are shown. As described above, the output threshold Vs is less than or equal to the input threshold Vt.

The operations will now be described for when the reference potential difference is small, that is, when the reference potential difference is 0 V or more, and is less than the output threshold Vs. As described above, when the reference potential difference is small, if the output voltage for a driving circuit Hi relative to the first potential P1 is the high-level voltage, the output voltage for a driving circuit Hi relative to the second potential P2 is the output threshold Vs or more. In a similar case, when the output voltage for the driving circuit Hi relative to the first potential P1 is the low-level voltage, the output voltage for the driving circuit Hi relative to the second potential P2 is less than the output threshold Vs. Also, the microcomputer 21 will not adjust the two output voltages relative to the first potential P1 to the high-level voltage at the same time. Therefore, when the reference potential difference is small, the subswitches 50 of the switch circuits J1 and J2 are off.

As described above, when the subswitch 50 of the switch circuit Ji is off, the output voltage for the driving circuit Hi relative to the second potential P2 is input to the driving circuit Hi as an input voltage. Therefore, when the microcomputer 21 adjusts the output voltage for the driving circuit Hi relative to the first potential P1 to the high-level voltage, the input voltage of the driving circuit Hi increases to the input threshold Vt or more. As described above, the high-level voltage is more than or equal to the input threshold Vt. When the input voltage of the driving circuit Hi increases to the input threshold Vt or more, the driving circuit Hi switches the main switch Fi on.

When the microcomputer 21 adjusts the output voltage for the driving circuit Hi relative to the first potential P1 to the low-level voltage, the input voltage of the driving circuit Hi decreases below the input threshold Vt. As described above, the low-level voltage is less than the input threshold Vt. When the input voltage of the driving circuit Hi decreases below the input threshold Vt, the driving circuit Hi switches the main switch Fi off.

The operations will now be described for when the reference potential difference is large, that is, when the reference potential difference is the output threshold Vs or more. As a result of the first potential P1 increasing relative to the second potential P2, the reference potential difference increases to the output threshold Vs or more. When the reference potential difference is large, both of the two output voltages relative to the second potential P2 are the output threshold Vs or more. When both of the two output voltages have increased to the output threshold Vs or more, the driving circuits H1 and H2 switch the subswitches 50 on.

When the subswitches 50 of the switch circuits J1 and J2 have been switched on in the adjustment circuit 30, the input voltages of the driving circuits H1 and H2 relative to the second potential P2 decrease to 0 V. As a result, the driving circuits H1 and H2 switch the main switches F1 and F2 off. While the reference potential difference is large, the two main switches F1 and F2 are kept off.

When the reference potential difference has decreased below the output threshold Vs, the subswitches 50 of the switch circuits J1 and J2 are switched off. As described above, when the subswitches 50 of the switch circuits J1 and J2 are off, the output voltages for the driving circuits Hi relative to the second potential P2 are input to the driving circuits Hi as an input voltage. The microcomputer 21 switches the main switch Fi on or off by adjusting the output voltage for the driving circuits Hi relative to the first potential P1.

Note that it is preferable that the output threshold Vs is less than the input threshold Vt. Assume that the period from when both of the two output voltages relative to the second potential P2 have increased to the output threshold Vs or more until the subswitches 50 of the switch circuits J1 and J2 are switched off is sufficiently short. In this case, after both of the two output voltages relative to the second potential P2 have increased to the output threshold Vs or more, all of the input voltages relative to the second potential P2 decrease to 0 V before all of the input voltages relative to the second potential P2 increase to the input threshold Vt or more. As described above, when the input voltage of the driving circuit Hi relative to the second potential P2 is less than the input threshold Vt, the driving circuit Hi keeps the main switch Fi off. As a result, the input voltages of the driving circuits H1 and H2 can be reduced before the main switches F1 and F2 are all switched on.

Example in which Reference Potential Difference Increases

Figure 5:
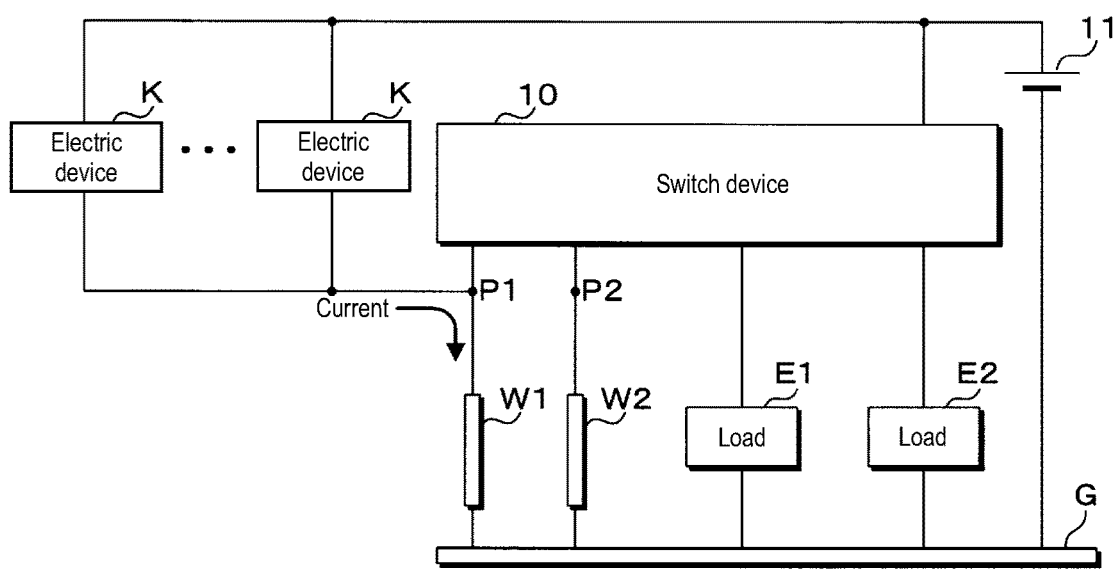
FIG. 5 is a diagram illustrating an example in which a reference potential difference increases.

FIG. 5 is a diagram illustrating an example in which the reference potential difference increases. In the example in FIG. 5, the power supply system 1 includes a plurality of electric devices K. The electric devices K are each connected between the positive electrode of the DC power supply 11 and the one end of the first conducting wire W1. When the electric devices K operate, currents flows from the positive electrode of the DC power supply 11 to the electric devices K, first conducting wire W1, and the conductor G in that order. Accordingly, power is supplied to the electric devices K. When an electric device K is not operating, no current will flow through the electric device K. As described above, the first conducting wire W1 has a resistance component. Therefore, when a current flows through the first conducting wire W1, a voltage drop occurs in the first conducting wire W1. As a result, the first potential P1 increases relative to the potential of the conductor G.

When the first potential P1 increases relative to the potential of the conductor G, the reference potential difference increases. As the current flowing through the first conducting wire W1 increases, the voltage drop increases. As the voltage drop increases, the reference potential difference increases as well. Therefore, as the current flowing through the first conducting wire W1 increases, the reference potential difference increases as well.

As the number of operating electric devices K increases, the current flowing through the first conducting wire W1 increases. Therefore, when the number of operating electric devices K has increased considerably, the reference potential difference may increase to the output threshold or more.

Note that even when the power supply system 1 does not include an electric device K, the reference potential difference may increase. For example, when disturbance noise is applied to one end of the first conducting wire W1, a current may flow through the first conducting wire W1. As described above, when a current flows through the first conducting wire W1, the reference potential difference increases.

Effects of Switch Device 10

In the switch device 10, when both of the two output voltages output from the microcomputer 21 have increased to the output threshold or more, the adjustment circuit 30 determines that the microcomputer 21 has output an erroneous output voltage, and reduces the input voltages of the driving circuits H1 and H2 to 0 V. Accordingly, the main switches F1 and F2 are switched off. As a result, the main switches F1 and F2 are appropriately switched to stop operation of the loads E1 and E2.

Embodiment 2

Two main switches are included in the switch device 10 in Embodiment 1. However, the number of main switches included in the switch device 10 is not limited to two.

The differences between Embodiment 2 and Embodiment 1 will be described below. The configurations other than the configurations described below are in common with Embodiment 1. Therefore, the constituent units that are in common with Embodiment 1 are given the same reference numerals as Embodiment 1, and their further description will be omitted.

Configuration of Power Supply System 1

Figure 6:
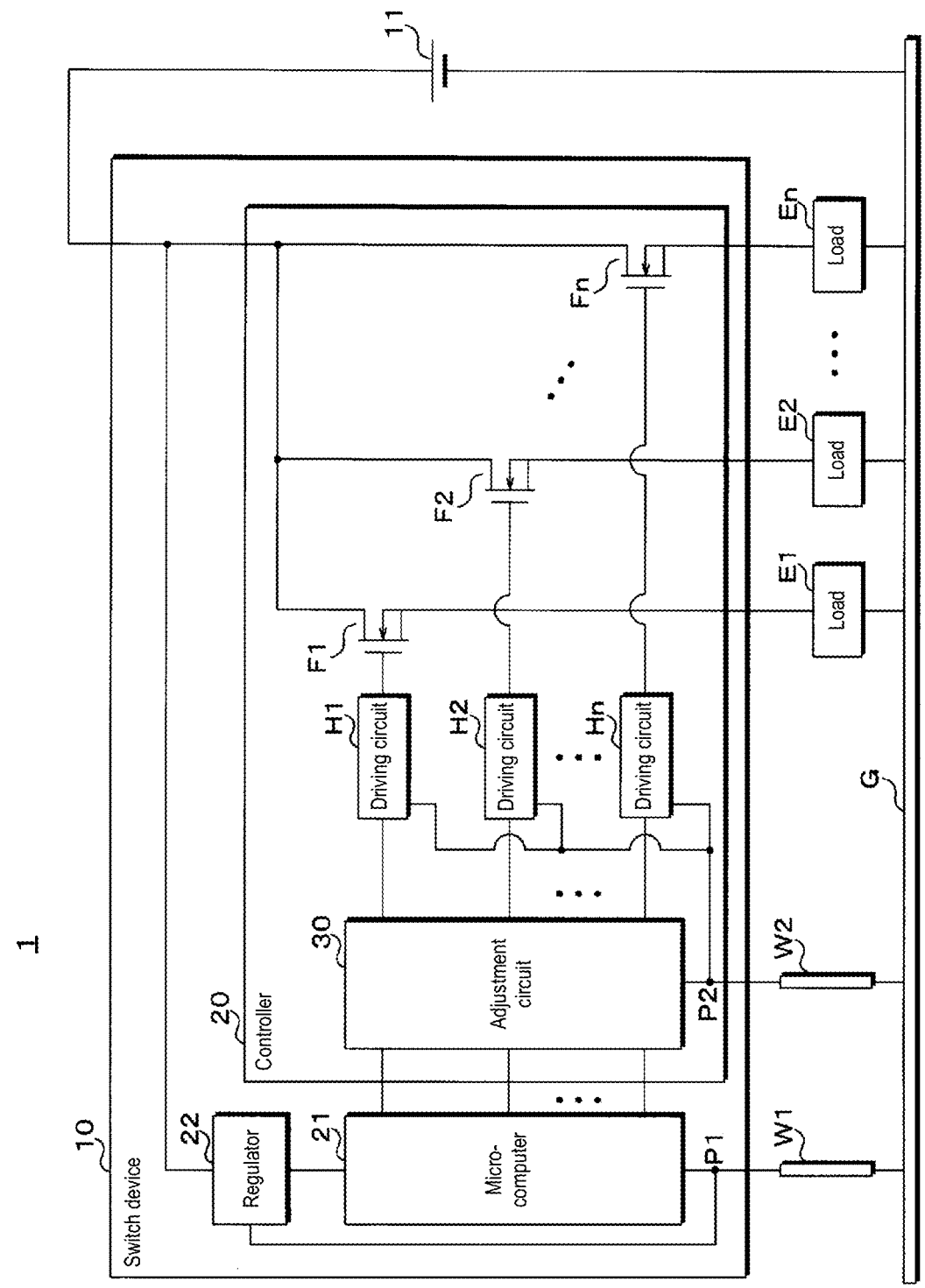
FIG. 6 is a block diagram illustrating the main configuration of a power supply system in Embodiment 2.

FIG. 6 is a block diagram illustrating the main configuration of a power supply system 1 in Embodiment 2. The power supply system 1 in Embodiment 2 includes a switch device 10, a DC power supply 11, and a conductor G, similarly to Embodiment 1. The power supply system 1 in Embodiment 2 further includes n loads E1, E2, . . . , En. Here, n is an integer of 3 or more.

In Embodiment 2, the integer i may be any of 1, 2, . . . , n. The switch device 10 includes n main switches F1, F2, . . . , Fn. The main switches Fi are configured similarly to Embodiment 1. The main switches Fi and the loads Ei are connected similarly to Embodiment 1. The positions of the conductor G at which a first conducting wire W1 and a second conducting wire W2 are respectively connected are different from each other.

The loads Ei operate similarly to Embodiment 1. The switch device 10 controls power supply to the loads Ei by switching the main switches Fi on or off, similarly to Embodiment 1. There is no situation in which the loads E1, E2, . . . , En need to be operated simultaneously. Therefore, there is no situation in which the switch device 10 needs to switch the n main switches F1, F2, . . . , Fn on at the same time.

Configuration of Switch Device 10

When the switch device 10 in Embodiment 2 is compared with the switch device 10 in Embodiment 1, the configuration of the controller 20 is different. The controller 20 in Embodiment 2 includes an adjustment circuit 30, similarly to Embodiment 1. The controller 20 in Embodiment 2 further includes n main switches F1, F2, . . . , Fn and n driving circuits H1, H2, . . . , Hn. The main switch Fi and the driving circuit Hi are configured similarly to those of Embodiment 1.

The microcomputer 21 outputs an output voltage for the driving circuit Hi, similarly to Embodiment 1. Therefore, the microcomputer 21 outputs n output voltages. The adjustment circuit 30 adjusts an input voltage input to the driving circuits Hi based on the output voltages for the driving circuits Hi. The driving circuits Hi switches the main switches Fi on or off, similarly to Embodiment 1.

The adjustment circuit 30 compares the output voltages of the microcomputer 21 relative to the second potential P2 with an output threshold, similarly to Embodiment 1. If at least one of the n output voltages output by the microcomputer 21 is less than the output threshold, the adjustment circuit 30 adjusts the input voltages of the driving circuits Hi to the output voltages for the driving circuits Hi relative to the second potential P2. If all of the n output voltages output by the microcomputer 21 are the output threshold or more, the adjustment circuit 30 reduces the input voltages of the n driving circuits H1, H2, . . . , Hn to 0 V. The n output voltages output by the microcomputer 21 correspond to n specific voltages.

The microcomputer 21 will not adjust the output voltages of the n driving circuits H1, H2, . . . , Hn relative to the first potential P1 to a high-level voltage at the same time. Therefore, if the reference potential difference is less than the output threshold, the adjustment circuit 30 adjusts the input voltages of the driving circuits Hi to the output voltages for the driving circuits Hi relative to the second potential P2. Therefore, the microcomputer 21 switches the main switches Fi on or off by adjusting the output voltages for the driving circuits Hi relative to the first potential P1 to the high-level voltage or the low-level voltage.

When the reference potential difference is the output threshold or more, all of the n output voltages output by the microcomputer 21 are the output threshold or more. Therefore, if the reference potential difference has increased to the output threshold or more, the adjustment circuit 30 reduces the input voltages of the n driving circuits H1, H2, . . . , Hn to 0 V. Accordingly, the n driving circuits H1, H2, . . . , Hn respectively switch the main switches F1, F2, . . . , Fn off. While the reference potential difference is the output threshold or more, the n driving circuits H1, H2, . . . , Hn keep the main switches F1, F2, . . . , Fn off.

As described above, when the microcomputer 21 erroneously outputs n output voltages that are the output threshold or more, the adjustment circuit 30 adjusts the input voltage of the n driving circuits H1, H2, . . . , Hn to 0 V. As a result, the driving circuits H1, H2, . . . , Hn respectively switch the main switches F1, F2, . . . , Fn off.

External Appearance of Switch Device 10

In Embodiment 2, the adjustment circuit 30, the n main switches F1, F2, . . . , Fn, and the n driving circuits H1, H2, . . . , Hn are disposed on a second circuit board B2.

Note that the microcomputer 21, the regulator 22, the adjustment circuit 30, the n main switches F1, F2, . . . , Fn, and the n driving circuits H1, H2, . . . , Hn may also be disposed on one circuit board.

Configuration of Adjustment Circuit 30

Figure 7:
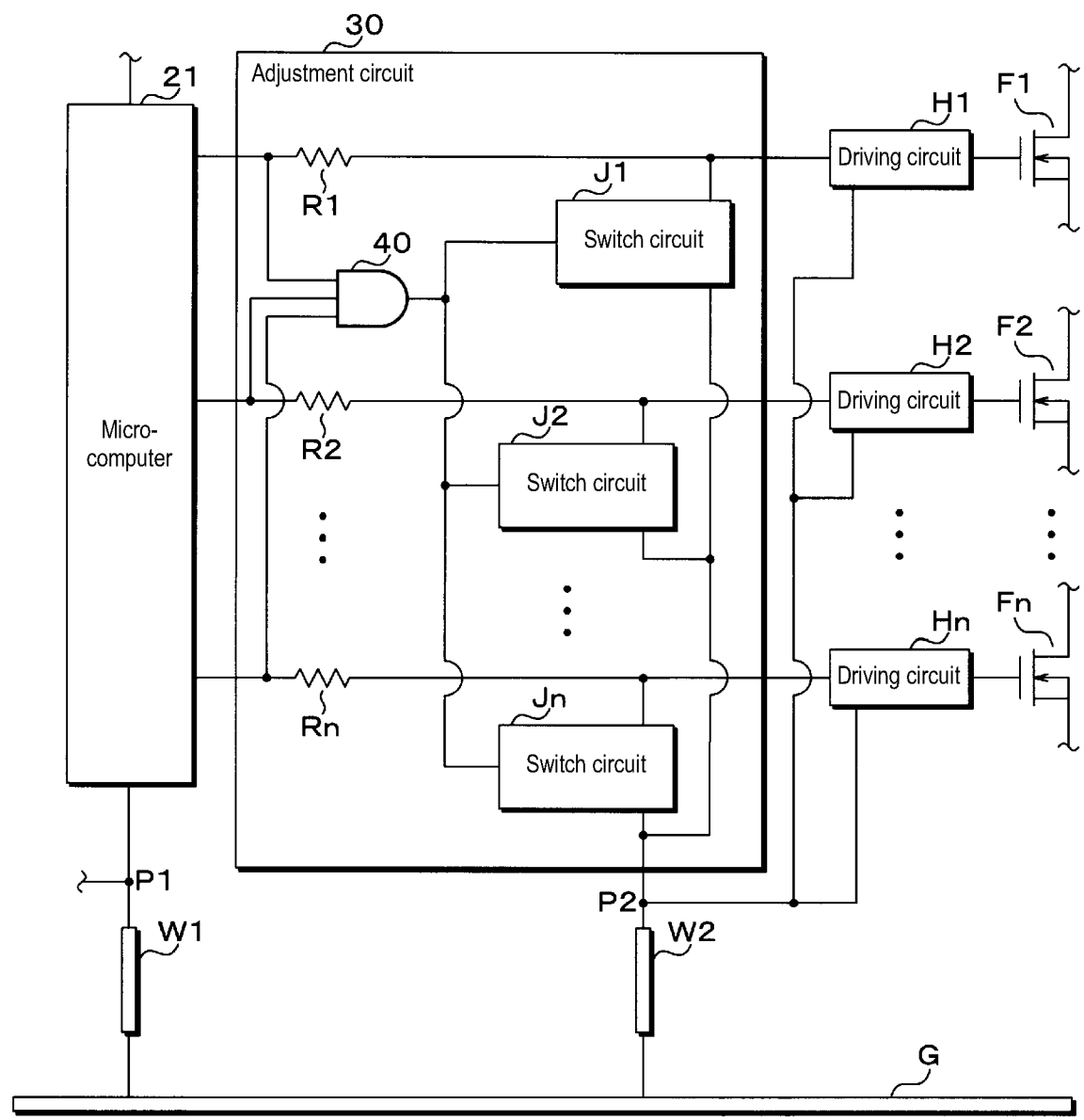
FIG. 7 is a circuit diagram of an adjustment circuit.

FIG. 7 is a circuit diagram of the adjustment circuit 30. The adjustment circuit 30 includes an AND circuit 40 similarly to Embodiment 1. The adjustment circuit 30 further includes n switch circuits J1, J2, . . . , Jn and n connection resistors R1, R2, . . . , Rn. In Embodiment 2, the AND circuit 40 has n input ends. The switch circuits Ji are each configured similarly to Embodiment 1, and include a subswitch 50 and circuit resistors 51 and 52. The connection resistor Ri and the switch circuit Ji are connected similarly to Embodiment 1.

Operations of Adjustment Circuit 30

The switch circuit Ji operates similarly to Embodiment 1. The AND circuit 40 compares the output voltage for the driving circuit Hi relative to the second potential P2 with the output threshold. If at least one of the n output voltages is less than the output threshold, the AND circuit 40 adjusts the voltage at an output end relative to the second potential P2 to 0 V. In this case, the subswitches 50 of the switch circuits J1, J2, . . . , Jn are off.

When the subswitch 50 of the switch circuit Ji is off, the output voltage for the driving circuit Hi relative to the second potential P2 is input to the driving circuit Hi as an input voltage, similarly to Embodiment 1. The microcomputer 21 switches the corresponding main switch Fi on or off by adjusting the output voltage for the driving circuit Hi relative to the first potential P1 to the high-level voltage or the low-level voltage.

If all of the n output voltages are the output threshold or more, the AND circuit 40 adjusts the voltage at the output end relative to the second potential P2 to a positive predetermined voltage. In this case, the subswitches 50 of the switch circuits J1, J2, . . . , Jn are on.

In the adjustment circuit 30, when the AND circuit 40 switches on the subswitches 50 of the n switch circuits J1, J2, . . . , Jn, the input voltages of the n driving circuits H1, H2, . . . , Hn relative to the second potential P2 decrease to 0 V. As described above, the input threshold exceeds 0 V. As a result, the driving circuits H1, H2, . . . , Hn respectively switch the main switches F1, F2, . . . , Fn off. While the reference potential difference is the output threshold or more, the n main switches F1, F2, ..., Fn are kept off.

Effects of Switch Device 10

In the switch device 10, when all of the n output voltages output from the microcomputer 21 have increased to the output threshold or more, the adjustment circuit 30 determines that the microcomputer 21 has output an erroneous output voltage, and reduces the input voltages of the n driving circuits H1, H2, ..., Hn to 0 V. Accordingly, the n main switches F1, F2, ..., Fn are switched off. As a result, appropriate switching of the main switches F1, F2, ..., Fn to stop operation of the n loads E1, E2, ..., En can be performed.

The switch device 10 in Embodiment 2 similarly achieves the effects achieved by the switch device 10 in Embodiment 1.

In Embodiment 2 as well, it is preferable that the output threshold is less than the input threshold. In this case, the input voltages of the driving circuits H1, H2, ..., Hn can be reduced before the main switches F1, F2, ..., Fn are all switched on.

Explanatory Note

The number of output voltages monitored by the adjustment circuit 30 in Embodiment 2 may be less than n. The number of output voltages monitored by the adjustment circuit 30 needs to be two or more. For example, when there are x output voltages that will not be adjusted to the high-level voltage by the microcomputer 21 at the same time, the adjustment circuit 30 need only monitor those x output voltages relative to the second potential. Here, x is an integer of 2 or more and less than n. In this case, the AND circuit 40 of the adjustment circuit 30 has x input ends. The AND circuit 40 is connected to one end of each of x connection resistors, of the n connection resistors R1, R2, ..., Rn, to which the x output voltages are respectively input. The output voltages monitored by the adjustment circuit 30 correspond to specific voltages.

If at least one of the x output voltages relative to the second potential is less than the output threshold, the adjustment circuit 30 adjusts the input voltage of the driving circuit Hi to the output voltage for the driving circuit Hi relative to the second potential. If all of the x output voltages relative to the second potential are the output threshold or more, the adjustment circuit 30 reduces the input voltages of the n driving circuits Hi, H2, ..., Hn to 0 V.

Embodiment 3

The loads to be connected to the switch device 10 in Embodiment 1 are not limited to electric devices in which a current flows only in one direction.

The differences between Embodiment 3 and Embodiment 1 will be described below. The configurations other than the configurations described below are in common with Embodiment 1. Therefore, the constituent units that are in common with Embodiment 1 are given the same reference numerals as Embodiment 1, and their further description will be omitted.

Configuration of Power Supply System 1

Figure 8:
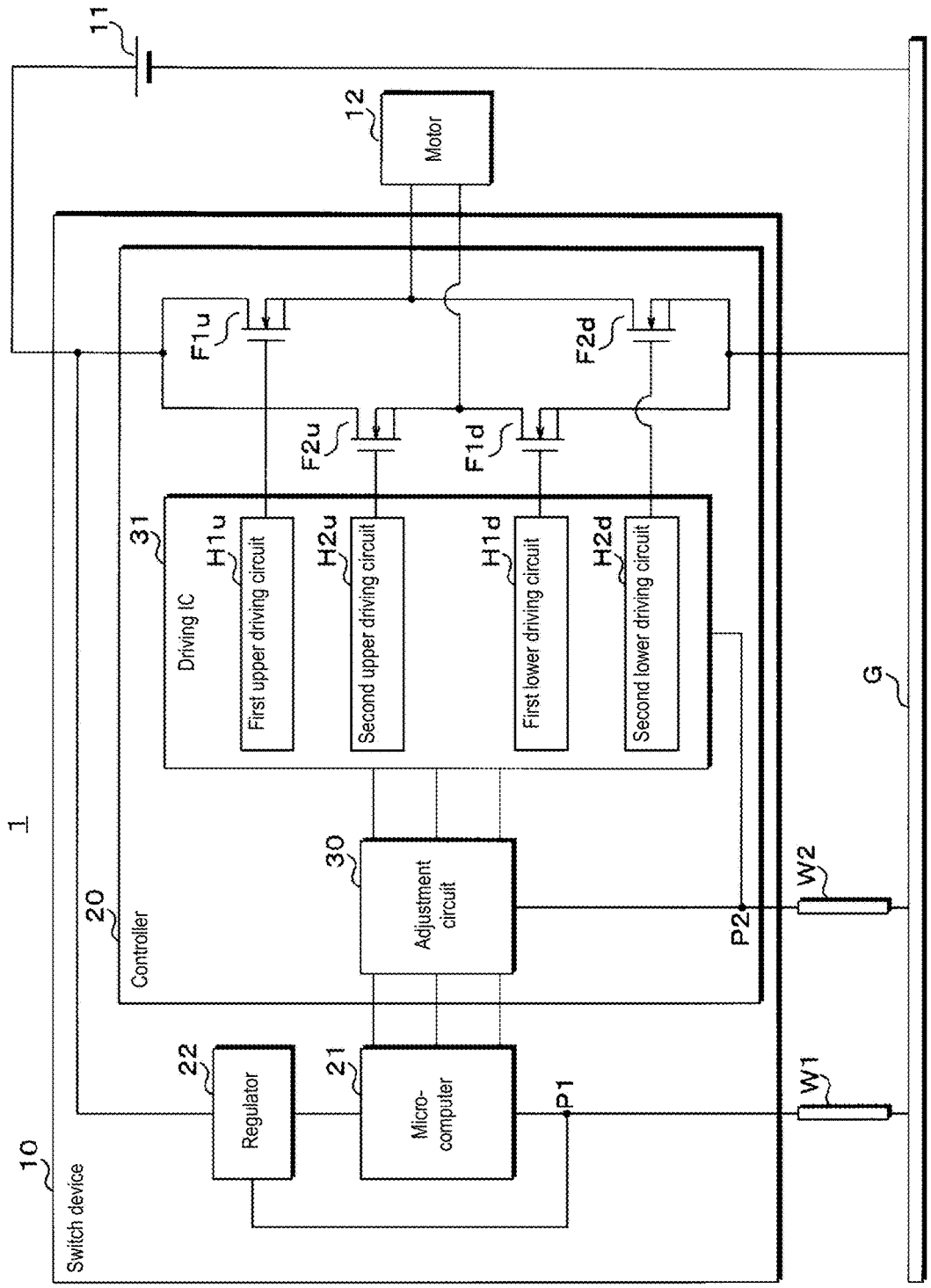
FIG. 8 is a block diagram illustrating the main configuration of a power supply system in Embodiment 3.

FIG. 8 is a block diagram illustrating the main configuration of a power supply system 1 in Embodiment 3. The power supply system 1 in Embodiment 3 includes a switch device 10 and a DC power supply 11, similarly to Embodiment 1. The power supply system 1 further includes a motor 12 as a load. The switch device 10 includes four main switches F1u, F1d, F2u, and F2d. The main switches F1u, F1d, F2u, and F2d are each configured similarly to the main switch F1 in Embodiment 1.

The negative electrode of the DC power supply 11 is connected to the conductor G. The drains of the main switches F1u and F2u are connected to the positive electrode of the DC power supply 11. The sources of the main switches F1u and F2u are respectively connected to the drains of the main switches F2d and F1d. The sources of the main switches F1d and F2d are connected to the conductor G. The motor 12 is connected between a connection node of the main switches F1u and F2d and a connection node of the main switches F2u and F1d. The switch device 10 is connected to one end of each of the first conducting wire W1 and second conducting wire W2. The other ends of the first conducting wire W1 and second conducting wire W2 are connected to the conductor G. The positions of the conductor G at which the first conducting wire W1 and the second conducting wire W2 are respectively connected are different from each other.

The state of the main switches F1u, F1d, F2u, and F2d is denoted as "switch state" below. The state in which the main switches F1u and F1d are on and the main switches F2u and F2d are off is denoted as "forward rotation state". The state in which the main switches F1u and F1d are off and the main switches F2u and F2d are on is denoted as "reverse rotation state". The state in which the main switches F1u and F2u are off and the main switches F1d and F2d are on is denoted as "discharge state". The state in which the main switches F1u, F1d, F2u, and F2d are off is denoted as an "off state".

The switch device 10 causes the switch state to transition between the forward rotation state, the reverse rotation state, the discharge state, and the off state by switching the main switches F1u, F1d, F2u, and F2d on or off. When the switch device 10 causes the switch state to transition to the forward rotation state, a current flows from the positive electrode of the DC power supply 11 to the main switch F1u, the motor 12, the main switch F1d, and the conductor G in that order. At this time, the motor 12 performs forward rotation. When the switch device 10 causes the switch state to transition to the reverse rotation state, a current flows from the positive electrode of the DC power supply 11 to the main switch F2u, the motor 12, the main switch F2d, and the conductor G in that order. At this time, the motor 12 performs reverse rotation.

For example, the motor 12 includes a columnar rotor that rotates about a shaft. The forward rotation is a clockwise rotation of the rotor. In this case, the reverse rotation is a counterclockwise rotation of the rotor. The motor 12 includes an inductor. Energy is accumulated in the inductor of the motor 12 while a current flows through the motor 12.

When the switch device 10 causes the switch state to transition to the discharge state, a current flows from one end of the motor 12 to the other end of the motor 12 through the main switches F1d and F2d. Accordingly, the energy accumulated in the inductor of the motor 12 is discharged. When the switch device 10 causes the switch state to transition to the off state, a flow of current through the motor 12 stops. When the switch state is in transition or the off state, the motor 12 stops rotating.

Configuration of Switch Device 10

When the switch device 10 in Embodiment 3 is compared with the switch device 10 in Embodiment 1, the configuration of the controller 20 differs. The controller 20 in Embodiment 3 includes an adjustment circuit 30, similarly to Embodiment 1. The controller 20 in Embodiment 3 further includes a driving IC 31 and the four main switches F1u, F1d, F2u, and F2d. The driving IC 31 includes a first upper driving circuit H1u, a first lower driving circuit H1d, a second upper driving circuit H2u, and a second lower driving circuit H2d.

The first upper driving circuit H1u, the first lower driving circuit H1d, the second upper driving circuit H2u, and the second lower driving circuit H2d are respectively connected to the gates of the main switches F1u, F1d, F2u, and F2d. The first upper driving circuit H1u, the first lower driving circuit H1d, the second upper driving circuit H2u, and the second lower driving circuit H2d respectively switch the main switches F1u, F1d, F2u, and F2d on or off, similarly to the driving circuit H1 in Embodiment 1.

The driving IC 31 is connected to the adjustment circuit 30. The adjustment circuit 30 is connected to the microcomputer 21. The adjustment circuit 30 and the driving IC 31 are connected to one end of the second conducting wire W2.

The microcomputer 21 outputs a first output voltage, a second output voltage, and a third output voltage. Therefore, the microcomputer 21 outputs three output voltages. The microcomputer 21 adjusts each of the first output voltage, second output voltage, and third output voltage relative to a first potential P1 to a high-level voltage or a low-level voltage.

The adjustment circuit 30 adjusts the first input voltage to be input to the driving IC 31 based on the first output voltage relative to a second potential P2. The adjustment circuit 30 adjusts the second input voltage to be input to the driving IC 31 based on the second output voltage relative to the second potential P2. The adjustment circuit 30 adjusts the third input voltage to be input to the driving IC 31 based on the third output voltage relative to the second potential P2. The driving IC 31 causes the switch state to transition to the forward rotation state, the reverse rotation state, the discharge state, or the off state according to the first input voltage, second input voltage, and third input voltage relative to the second potential P2.

Figure 9:
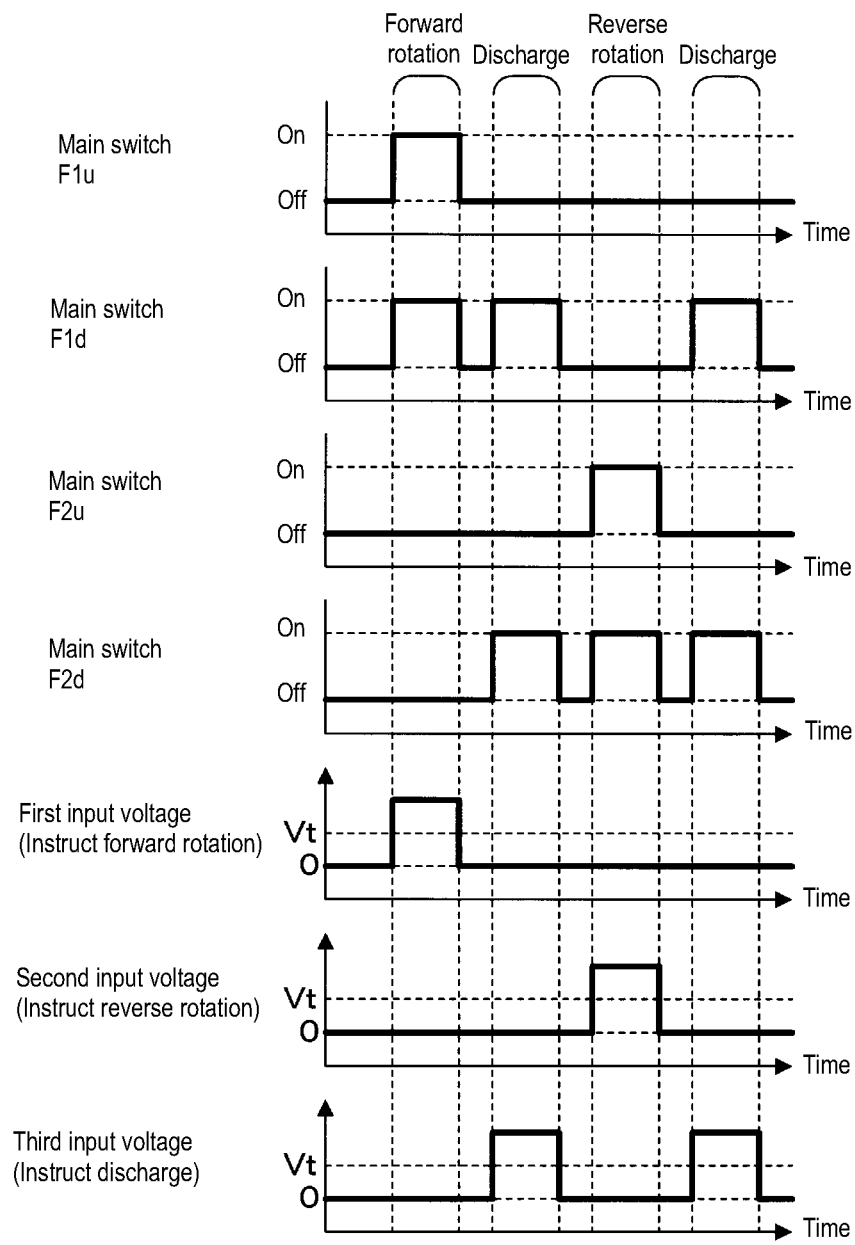
FIG. 9 is a timing chart illustrating operations of a driving IC.

FIG. 9 shows timing charts for illustrating operations of the driving IC 31. In FIG. 9, the transitions in state of the main switches F1u, F1d, F2u, and F2d and the changes in the first input voltage, second input voltage, and third input voltage are shown. The horizontal axes of the chart show time. The input threshold is denoted as Vt in FIG. 9 as well.

When the first input voltage is the input threshold Vt or more and the second and third input voltages are less than the input threshold Vt, the first upper driving circuit H1u and the first lower driving circuit H1d respectively switch the main switches F1u and F1d on. Also, the second upper driving circuit H2u and the second lower driving circuit H2d respectively switch the main switches F2u and F2d off. With this, the switch state transitions to the forward rotation state. By adjusting the first input voltage to the input threshold Vt or more, forward rotation of the motor 12 is instructed.

When the second input voltage is the input threshold Vt or more and the first and third input voltages are less than the input threshold Vt, the first upper driving circuit H1u and the first lower driving circuit H1d respectively switch the main switches F1u and F1d off. Also, the second upper driving circuit H2u and the second lower driving circuit H2d respectively switch the main switches F2u and F2d on. With this, the switch state transitions to the reverse rotation state. By adjusting the second input voltage to the input threshold Vt or more, reverse rotation of the motor 12 is instructed.

When the third input voltage is the input threshold Vt or more and the first and second input voltages are less than the input threshold Vt, the first upper driving circuit H1u and the second upper driving circuit H2u respectively switch the main switches F1u and F2u off. Also, the first lower driving circuit H1d and the second lower driving circuit H2d respectively switch the main switches F1d and F2d on. With this, the switch state transitions to the discharge state. By adjusting the third input voltage to the input threshold Vt or more, discharging of the motor 12 is instructed.

When the first, second, and third input voltages are less than the input threshold Vt, the first upper driving circuit H1u, the first lower driving circuit H1d, the second upper driving circuit H2u, and the second lower driving circuit H2d respectively switch the main switches F1u, F1d, F2u, and F2d off. With this, the switch state transitions to the off state.

As described above, the driving IC 31 causes the switch state to transition to the forward rotation state, the reverse rotation state, the discharge state, or the off state based on the first, second, and third input voltages.

The adjustment circuit 30 shown in FIG. 8 compares the first, second, and third output voltages relative to the second potential P2 with an output threshold. If at least one of the first, second, and third output voltages is less than the output threshold, the adjustment circuit 30 respectively adjusts the first, second, and third input voltages to the first, second, and third output voltages relative to the second potential P2. If all of the first, second, and third output voltages are the output threshold or more, the adjustment circuit 30 reduces the first, second, and third input voltages to 0 V. The first, second, and third output voltages correspond to three specific voltages.

The output threshold is less than or equal to the input threshold, similarly to Embodiment 1. The high-level voltage is more than or equal to the input threshold. The low-level voltage is 0 V and is less than the output threshold. First, the operations of the switch device 10 when the reference potential difference is 0 V or more and less than the output threshold will be described. When the first output voltage relative to the first potential P1 is adjusted to the high-level voltage, the first output voltage relative to the second potential P2 is the output threshold or more. Similarly, when the second output voltage relative to the first potential P1 is adjusted to the high-level voltage, the second output voltage relative to the second potential P2 is the output threshold or more. When the third output voltage relative to the first potential P1 is adjusted to the high-level voltage, the third output voltage relative to the second potential P2 is the output threshold or more.

When the first output voltage relative to the first potential P1 is adjusted to the low-level voltage, the first output voltage relative to the second potential P2 is less than the output threshold. Similarly, when the second output voltage relative to the first potential P1 is adjusted to the low-level voltage, the second output voltage relative to the second potential P2 is less than the output threshold. When the third output voltage relative to the first potential P1 is adjusted to the low-level voltage, the third output voltage relative to the second potential P2 is less than the output threshold.

The microcomputer 21 will not adjust the first, second, and third output voltages relative to the first potential P1 to the high-level voltage at the same time. Specifically, the microcomputer 21 adjusts only one of the first, second, and third output voltages relative to the first potential P1 to the high-level voltage. Therefore, the adjustment circuit 30 respectively adjusts the first, second, and third input voltages to the first, second, and third output voltages relative to the second potential P2.

When the microcomputer 21 adjusts only the first output voltage relative to the second potential P2 to the high-level voltage, the driving IC 31 causes the switch state to transition to the forward rotation state. When the microcomputer 21 adjusts only the second output voltage relative to the second potential P2 to the high-level voltage, the driving IC 31 causes the switch state to transition to the reverse rotation state. When the microcomputer 21 adjusts only the third output voltage relative to the second potential P2 to the high-level voltage, the driving IC 31 causes the switch state to transition to the discharge state. When the microcomputer 21 adjusts the first, second, and third output voltages relative to the second potential P2 to the low-level voltage, the driving IC 31 causes the switch state to transition to the off state.

Therefore, when the reference potential difference exceeds 0 V and is less than the output threshold, the microcomputer 21 causes the switch state to transition to the forward rotation state, the reverse rotation state, the discharge state, or the off state by adjusting each of the first, second, and third output voltages relative to the first potential P1 to the high-level voltage or the low-level voltage.

As shown in FIG. 9, when the switch state, in the forward rotation state, is caused to transition to the reverse rotation state, the microcomputer 21 causes the switch state to transition to the off state in order to prevent the both ends of the DC power supply 11 from being short-circuited. Next, the microcomputer 21 causes the switch state to transition to the discharge state. With this, the energy accumulated in the inductor of the motor 12 is discharged. Thereafter, the microcomputer 21 again causes the switch state to transition to the off state. Finally, the microcomputer 21 causes the switch state to transition to the reverse rotation state.

When the switch state, in the reverse rotation state, is caused to transition to the forward rotation state, the microcomputer 21 similarly causes the switch state to transition to the off state, the discharge state, the off state, and the forward rotation state in that order.

The operations of the switch device 10 when the reference potential difference is the output threshold or more will be described next. When the reference potential difference is the output threshold or more, the first, second, and third output voltages are the output threshold or more, and will not decrease below the output threshold. Therefore, the adjustment circuit 30 reduces the first, second, and third input voltages to 0 V. As described in Embodiment 1, the input threshold exceeds 0 V. Therefore, when the adjustment circuit 30 has reduced the first, second, and third input voltages to 0 V, the driving IC 31 causes the switch state to transition to the off state.

As described above, when the microcomputer 21 has erroneously output the first, second, and third output voltages that are the output threshold or more, the adjustment circuit 30 reduces the first, second, and third input voltages to 0 V. As a result, the driving IC 31 causes the switch state to transition to the off state.

External Appearance of Switch Device 10

In Embodiment 3, the adjustment circuit 30, the four main switches F1*u*, F1*d*, F2*u*, and F2*d*, and the driving IC 31 are disposed on a second circuit board B2.

Note that the microcomputer 21, the regulator 22, the adjustment circuit 30, the four main switches F1*u*, F1*d*, F2*u*, and F2*d*, and the driving IC 31 may also be disposed on one circuit board.

Configuration of Adjustment Circuit 30

The adjustment circuit 30 in Embodiment 3 is configured similarly to the adjustment circuit 30 in Embodiment 2 when the integer n is 3. The microcomputer 21 outputs the first, second, and third output voltages to respective ends, on one side, of the connection resistors R1, R2, and R3. The other ends of the three connection resistors R1, R2, and R3 are separately connected to the driving IC 31. The driving IC 31 causes the switch state to transition to the forward rotation state, the reverse rotation state, the discharge state, or the off state according to the first, second, and third input voltages that are input from the other ends of the connection resistors R1, R2, and R3.

Operations of Adjustment Circuit 30

Figure 10:
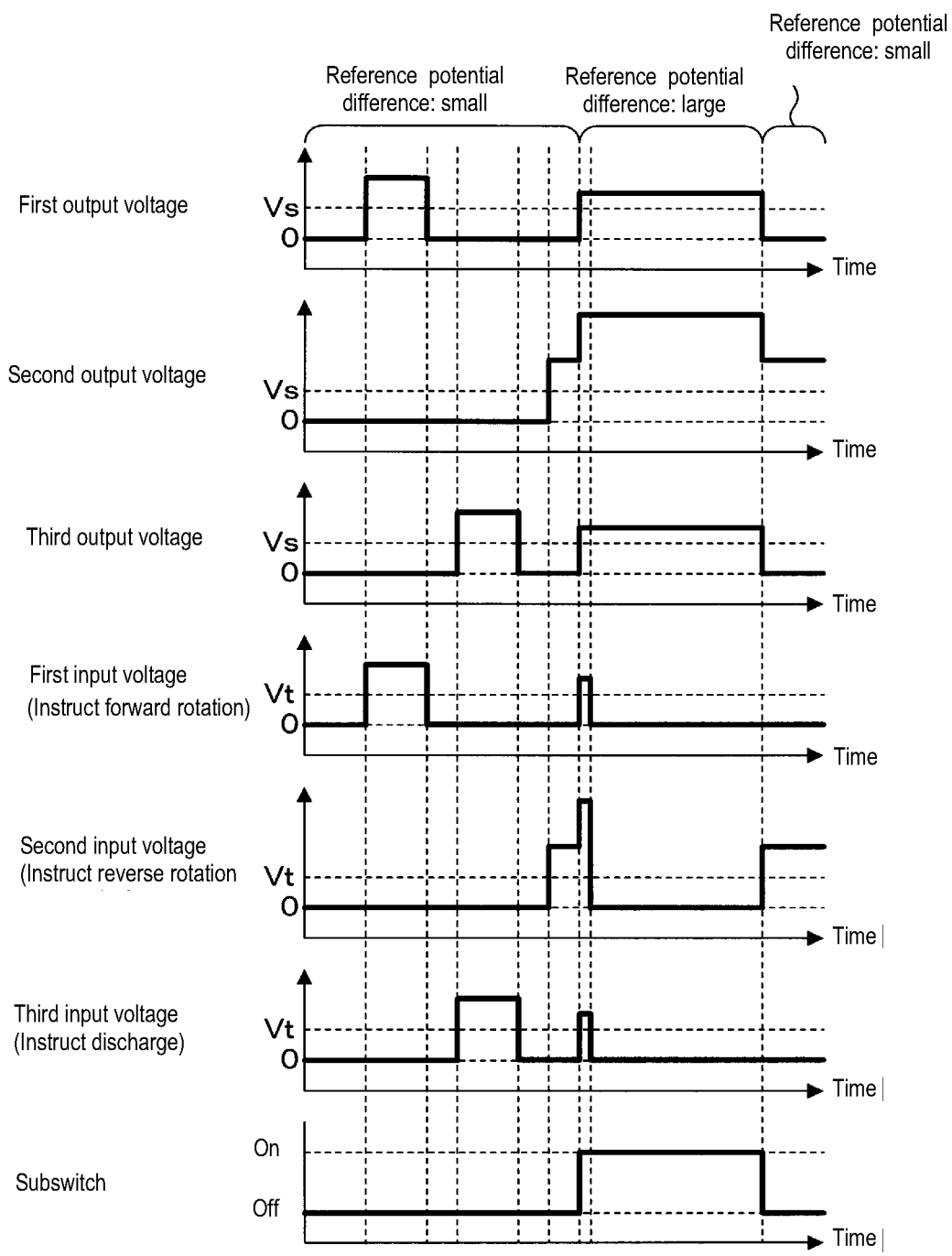
FIG. 10 is a timing chart illustrating operations of an adjustment circuit.

FIG. 10 is a timing chart for illustrating operations of the adjustment circuit 30. In FIG. 10, the changes in the first, second, and third output voltages and the first, second, and third input voltages relative to the second potential P2 are shown. Also, the transitions in state of subswitches 50 of switch circuits J1, J2, and J3 are shown in FIG. 10. The states of the three subswitches 50 are always the same. In FIG. 10 as well, the output threshold and the input threshold are respectively denoted as Vs and Vt.

The operations when the reference potential difference is small, that is, when the reference potential difference is 0 V or more and less than the output threshold Vs will be described next. When the reference potential difference is small, the AND circuit 40 keeps the subswitches 50 of the switch circuits J1, J2, and J3 off. When the subswitches 50 of the switch circuits J1, J2, and J3 are off, the first, second, and third output voltages relative to the second potential P2 are input to the driving IC 31 as the first, second, and third input voltages, respectively. Therefore, as described above, the microcomputer 21 causes the switch state to transition to the forward rotation state, the reverse rotation state, the discharge state, or the off state by adjusting the first, second, and third output voltages relative to the first potential P1.

The operations when the reference potential difference is large, that is, the reference potential difference is the output threshold Vs or more will be described next. As a result of the first potential P1 increasing relative to the second potential P2, the reference potential difference increases to the output threshold Vs or more. When the reference potential difference is large, all of the first, second, and third output voltages relative to the second potential P2 are the output threshold Vs or more. When all of the first, second, and third output voltages have increased to the output threshold Vs or more, the AND circuit 40 switches the subswitches 50 of the switch circuits J1, J2, and J3 on.

In the adjustment circuit 30, when the subswitches 50 of the switch circuits J1, J2, and J3 are switched on, the first, second, and third input voltages relative to the second potential P2 decrease to 0 V. As a result, the driving IC 31 causes the switch state to transition to the off state. While the reference potential difference is large, the switch state is fixed to the off state.

When the reference potential difference has decreased below the output threshold Vs, the AND circuit 40 switches the subswitches 50 of the switch circuits J1, J2, and J3 off. As described above, when the subswitches 50 of the switch circuits J1, J2, and J3 are off, the first, second, and third output voltages relative to the second potential P2 are input to the driving IC 31 as the first, second, and third input voltages, respectively. The microcomputer 21 causes the switch state to transition to the forward rotation state, the reverse rotation state, the discharge state, or the off state by adjusting the first, second, and third output voltages relative to the first potential P1.

Effects of Switch Device 10

In the switch device 10, when all of the first, second, and third output voltages output from the microcomputer 21 have increased to the output threshold or more, the adjustment circuit 30 determines that the microcomputer 21 has output an erroneous output voltage, and reduces the first, second, and third input voltages to 0 V. Accordingly, the switch state transitions to the off state. As a result, the main switches F1u, F1d, F2u, and F2d are switched such that the motor 12 stops operating.

The switch device 10 in Embodiment 3 similarly achieves the effects achieved by the switch device 10 in Embodiment 1.

In Embodiment 3 as well, it is preferable that the output threshold is less than the input threshold. In this case, the first, second, and third input voltages can be reduced before the main switches F1u, F1d, F2u, and F2d are all switched on.

Explanatory Note

In Embodiment 3, a configuration may also be adopted in which when all of the first, second, and third output voltages have increased to the output threshold or more, the adjustment circuit 30 reduces only the first and second input voltages to 0 V. In this configuration, when all of the first, second, and third output voltages have increased to the output threshold or more, the driving IC 31 causes the switch state to transition to the discharge state.

Also, the microcomputer 21 adjusts only one of the first, second, and third output voltages relative to the first potential P1 to the high-level voltage. Therefore, if the reference potential difference is less than the output threshold, the microcomputer 21 will not adjust two of the first, second, and third output voltages relative to the second potential P2 to the high-level voltage. Therefore, the output voltages to be monitored by the adjustment circuit 30 may also be two of the first, second, and third output voltages.

In this case, the AND circuit 40 of the adjustment circuit 30 has two input ends. Two of the first, second, and third output voltages are input to the AND circuit 40. If at least one of the two output voltages relative to the second potential is less than the output threshold, the adjustment circuit 30 respectively adjusts the first, second, and third input voltages to the first, second, and third output voltages relative to the second potential. If both of the two output voltages relative to the second potential are the output threshold or more, the adjustment circuit 30 reduces the first, second, and third input voltages to 0 V.

Embodiment 4

In Embodiment 1, the adjustment circuit 30 monitors the output voltages for the driving circuits Hi. However, the output voltages monitored by the adjustment circuit 30 are not limited to the output voltages for the driving circuits Hi.

The differences between Embodiment 4 and Embodiment 1 will be described below. The configurations other than the configurations described below are in common with Embodiment 1. Therefore, the constituent units that are the same as in Embodiment 1 are given the same reference numerals as in Embodiment 1, and their further description will be omitted.

Configuration of Power Supply System 1

Figure 11:
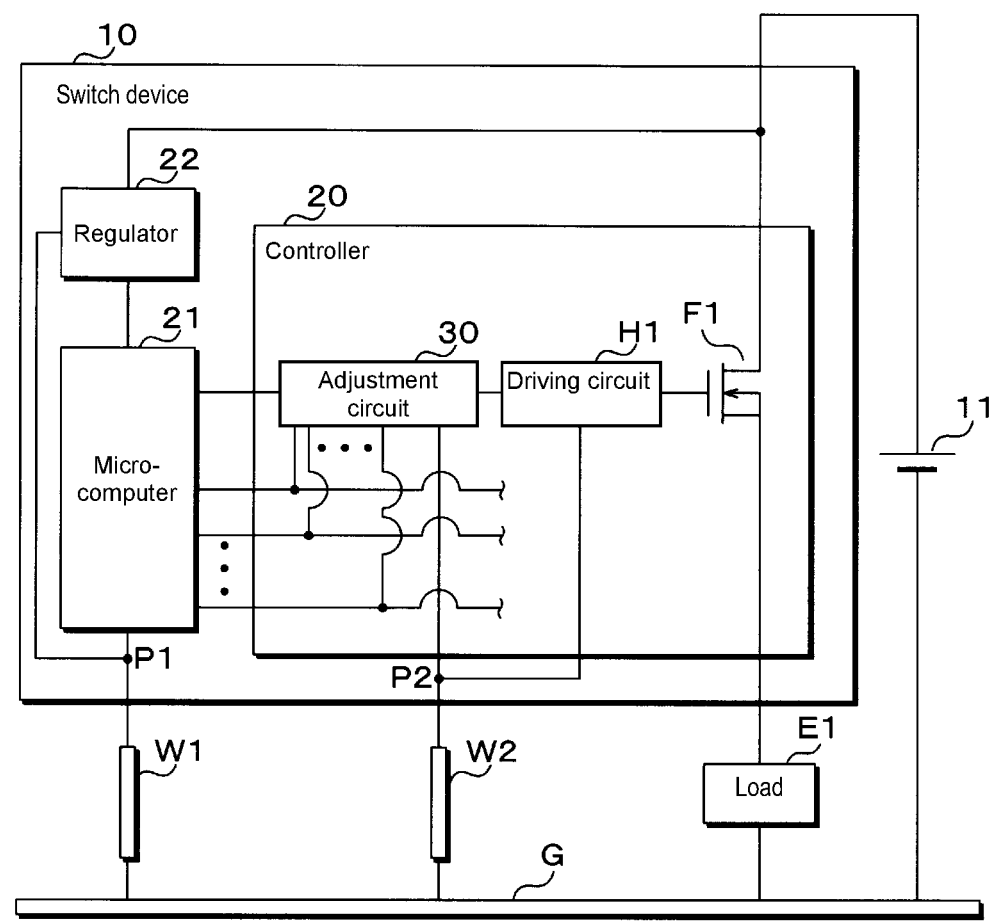
FIG. 11 is a block diagram illustrating the main configuration of a power supply system in Embodiment 4.

FIG. 11 is a block diagram illustrating the main configuration of a power supply system 1 in Embodiment 4. The power supply system 1 in Embodiment 4 includes the constituent units included in the power supply system 1 in Embodiment 1 other than the load E2. The switch device 10 in Embodiment 4 includes a main switch F1 similarly to Embodiment 1. The switch device 10 in Embodiment 4 controls the operations of a load E1 by switching a main switch F1 on or off.

Configuration of Switch Device 10

The switch device 10 in Embodiment 4 includes a controller 20, a microcomputer 21, and a regulator 22, similarly to Embodiment 1. The controller 20 includes an adjustment circuit 30, a main switch F1, and a driving circuit H1, similarly to Embodiment 1. The microcomputer 21 outputs a plurality of output voltages. The microcomputer 21 adjusts each of the plurality of output voltages relative to the first potential P1 to a high-level voltage or a low-level voltage.

The plurality of output voltages to be output from the microcomputer 21 includes an output voltage for the driving circuit H1 and a plurality of output voltages for monitoring. The output voltages for monitoring will be denoted as specific voltages below. As described in Embodiment 1, the adjustment circuit 30 adjusts the input voltage to be input to the driving circuit H1 based on the output voltage for the driving circuit H1. If the input voltage relative to the second potential P2 is an input threshold or more, the driving circuit H1 switches the main switch F1 on. If the input voltage relative to the second potential P2 is less than the input threshold, the driving circuit H1 switches the main switch F1 off.

The adjustment circuit 30 compares the plurality of specific voltages relative to the second potential P2 with an output threshold. If at least one of the plurality of specific voltages output from the microcomputer 21 is less than the output threshold, the adjustment circuit 30 adjusts the input voltage of the driving circuit H1 to the output voltage for the driving circuit H1 relative to the second potential P2. If all of the plurality of specific voltages output from the microcomputer 21 are the output threshold or more, the adjustment circuit 30 reduces the input voltage of the driving circuit H1 to 0 V.

The output threshold is less than or equal to the input threshold, similarly to Embodiment 1. The high-level voltage is more than or equal to the input threshold. The low-level voltage is 0 V and is less than the output threshold. First, the operations of the switch device 10 when the reference potential difference is 0 V or more and less than the output threshold will be described. When the output voltage of the microcomputer 21 relative to the first potential P1 is adjusted to the high-level voltage, the output voltage of the microcomputer 21 relative to the second potential P2 is the output threshold or more. When the output voltage of the microcomputer 21 relative to the first potential P1 is adjusted to the low-level voltage, the output voltage of the microcomputer 21 relative to the second potential P2 is less than the output threshold.

The microcomputer 21 will not adjust the plurality of specific voltages relative to the first potential P1 to the high-level voltage at the same time. Therefore, the adjustment circuit 30 adjusts the input voltage of the driving circuit H1 to the output voltage for the driving circuit H1 relative to the second potential P2. When the microcomputer 21 has adjusted the output voltage relative to the first potential P1 to the high-level voltage, the driving circuit H1 switches the main switch F1 on. When the microcomputer 21 has adjusted the output voltage relative to the first potential P1 to the low-level voltage, the driving circuit H1 switches the main switch F1 off.

Therefore, when the reference potential difference exceeds 0 V and is less than the output threshold, the microcomputer 21 switches the main switch F1 on or off by adjusting the output voltage for the driving circuit H1 relative to the first potential P1 to the high-level voltage or the low-level voltage.

Next, the operations of the switch device 10 when the reference potential difference is the output threshold or more will be described. When the reference potential difference is the output threshold or more, all of the plurality of specific voltages relative to the second potential P2 are the output threshold or more. The adjustment circuit 30 reduces the input voltage of the driving circuit H1 to 0 V. As described above, the input threshold exceeds 0 V. Therefore, when the adjustment circuit 30 has reduced the input voltage of the driving circuit H1 to 0 V, the driving circuit H1 switches the main switch F1 off.

As described above, if the microcomputer 21 erroneously outputs the plurality of output voltages that are the output threshold or more at the same time, the adjustment circuit 30 reduces the input voltage of the driving circuit H1 to 0 V. As a result, the driving circuit H1 switches the main switch F1 off.

When the number of the specific voltages is two, a voltage to instruct on or off of a switch is an example of a first specific voltage. In this case, a voltage to instruct to cut off a dark current is an example of a second specific voltage. By switching the first specific voltage to the high-level voltage, switching on of the switch is instructed. By switching the second specific voltage to the high-level voltage, cutting off of the dark current is instructed. The first and second specific voltages will not be switched to the high-level voltage at the same time.

External Appearance of Switch Device 10

In Embodiment 4, the adjustment circuit 30, the main switch F1, and the driving circuit H1 are disposed on a second circuit board B2.

Note that the microcomputer 21, the regulator 22, the adjustment circuit 30, the main switch F1, and the driving circuit H1 may also be disposed on one circuit board.

Configuration of Adjustment Circuit 30

Figure 12:
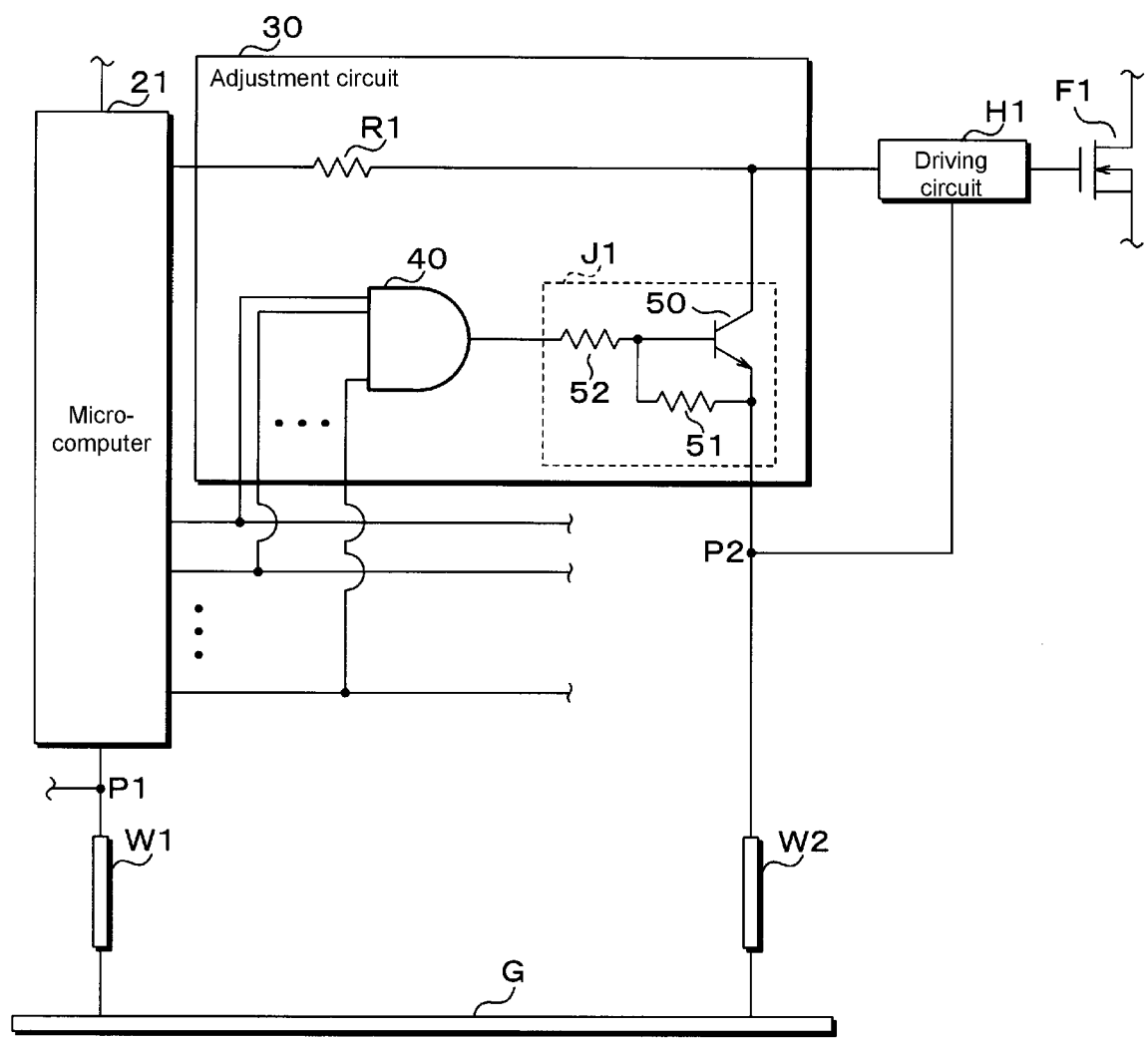
FIG. 12 is a circuit diagram of an adjustment circuit.

FIG. 12 is a circuit diagram of the adjustment circuit 30. The adjustment circuit 30 includes an AND circuit 40, a switch circuit J1, and a connection resistor R1, similarly to Embodiment 1. The AND circuit 40 has a plurality of input ends. The plurality of specific voltages output from the microcomputer 21 are input to the AND circuit 40. The output voltage for the driving circuit H1 output from the microcomputer 21 is output to one end of the connection resistor R1.

Operations of Adjustment Circuit 30

The switch circuit J1 operates similarly to Embodiment 1. The AND circuit 40 compares the plurality of specific voltages relative to the second potential P2 with the output threshold. If at least one of the plurality of specific voltages is less than the output threshold, the AND circuit 40 adjusts the voltage at an output end relative to the second potential P2 to 0 V. In this case, the subswitch 50 of the switch circuit J1 is off.

Similarly to Embodiment 1, when the subswitch 50 of the switch circuit J1 is off, the output voltage for the driving circuit H1 relative to the second potential P2 is input to the driving circuit H1 as an input voltage. The microcomputer 21 switches the main switch Fi on or off by adjusting the output voltage for the driving circuit H1 relative to the first potential P1 to the high-level voltage or the low-level voltage.

If all of the plurality of specific voltages are the output threshold or more, the AND circuit 40 adjusts the voltage at the output end relative to the second potential P2 to a positive predetermined voltage. In this case, the subswitch 50 of the switch circuit J1 is on.

In the adjustment circuit 30, when the AND circuit 40 switches the subswitch 50 of the switch circuit J1 on, the input voltage of the driving circuit H1 relative to the second potential P2 decreases to 0 V. As described above, the input threshold exceeds 0 V. As a result, the driving circuit H1 switches the main switch F1 off. While the reference potential difference is the output threshold or more, the main switch F1 is kept off.

Effects of Switch Device 10

In the switch device 10, when all of the specific voltages output from the microcomputer 21 have increased to the output threshold or more, the adjustment circuit 30 determines that the microcomputer 21 has output an erroneous output voltage, and reduces the input voltage of the driving circuit H1 to 0 V. Accordingly, the main switch F1 is switched off. As a result, appropriate switching of the main switch F1 to stop operation of the load E1 can be performed.

The switch device 10 in Embodiment 4 similarly achieves the effects achieved by the switch device 10 in Embodiment 1.

In Embodiment 4 as well, it is preferable that the output threshold is less than the input threshold. In this case, the input voltage of the driving circuit H1 can be reduced before the main switch F1 is switched on.

Explanatory Note

In Embodiment 4, the number of each of the load E1, the main switch F1, the driving circuit H1, the switch circuit J1, and the connection resistor R1 is not limited to one, and may also be two or more. The subswitch 50 of each switch circuit J1 is switched on or off according to the voltage at an output end of the shared AND circuit 40.

Modifications

In Embodiments 1 to 4, the first potential P1 and the second potential P2 may also be a potential at the same place. For example, in Embodiments 1 to 4, a constituent unit connected to the one end of the second conducting wire W2 is connected to the one end of the first conducting wire W1. In this configuration, when the microcomputer 21 has erroneously adjusted the output voltages to the high-level voltage at the same time, the adjustment circuit 30 reduces the input voltages to 0 V.

In Embodiment 1, 2, and 4, when the input voltage of a driving circuit has decreased below the input threshold, the driving circuit may switch the main switch on. In this case, when all of the output voltages corresponding to the specific voltages are the output threshold or more, the driving circuit switches the main switch on, and keep the main switch on. When the input voltage of the driving circuit is the input threshold or more, the driving circuit switches the main switch off.

A driving circuit that switches the main switch off when the input voltage has decreased below the input threshold is denoted as "first driving circuit". A driving circuit that switches the main switch on when the input voltage has decreased below the input threshold is denoted as "second driving circuit". When the switch device 10 includes a plurality of driving circuits, the plurality of driving circuits may include a first driving circuit and a second driving circuit.

For example, a main switch for a load that will not obstruct driving of a vehicle is preferably kept off when the microcomputer 21 has output an erroneous voltage, in order to suppress wasteful power consumption of the DC power supply 11. For example, a main switch for a load that may obstruct driving of a vehicle when stops operating is preferably kept on when the microcomputer 21 has output an erroneous voltage.

The configuration of Embodiment 3 can be applied to an apparatus in which two main switches are complementarily switched on or off, such as a voltage transformer that performs chopper control.

In Embodiments 1 to 4, the main switches F1 to Fn, F1u, F1d, F2u, and F2d each need only be a switch that is switched on or off by a driving circuit. Therefore, the main switches F1 to Fn, F1u, F1d, F2u, and F2d are not limited to N-channel FETs, and may be P-channel FETs, bipolar transistors, relay contacts, or the like.

In Embodiments 1 to 4, the subswitch 50 need only be a switch that is switched on or off according to a voltage at an output end of the AND circuit 40. Therefore, the subswitch 50 is not limited to an NPN bipolar transistor, and may also be a PNP bipolar transistor, an FET, a relay contact, or the like.

Embodiments 1 to 4 disclosed herein are illustrative in all aspects and should not be considered restrictive. The scope of the present disclosure is indicated by the scope of claims, not the above-mentioned meaning, and is intended to include all modifications within the meaning and scope equivalent to the scope of claims.

The invention claimed is:

1. A switch device comprising:
    an output unit configured to output a plurality of voltages;
    a switch;
    a resistor whose one end receives one output voltage output by the output unit;
    a switching circuit configured to switch the switch on or off according to a resistor voltage at the other end of the resistor; and
    a reduction circuit configured to, when all of a plurality of specific voltages included in the plurality of output voltages output by the output unit are an output threshold or more, reduce the resistor voltage.

2. The switch device according to claim 1,
    wherein the switching circuit, when the resistor voltage has increased to a resistor threshold or more, switches the switch on, and when the resistor voltage has decreased below the resistor threshold, switches the switch off, and
    when all of the plurality of specific voltages are the output threshold or more, the reduction circuit reduces the resistor voltage to below the resistor threshold.

3. The switch device according to claim 2, wherein the output threshold is less than the resistor threshold.

4. The switch device according to claim 1,
    wherein a current flows through a resistor member having a resistance component and a conductor in this order,
    the output unit adjusts the plurality of output voltages relative to a first potential at one end of the resistor member on an upstream side,
    the switching circuit switches the switch on or off according to the resistor voltage relative to a second potential at a place different from the one end of the resistor member on the upstream side, and
    the reduction circuit reduces the resistor voltage when all of the plurality of specific voltages relative to the second potential are the output threshold or more.

5. The switch device according to claim 1, further comprising
    a second switch whose one end is connected to the other end of the resistor,
    wherein when the second switch is on, a current flows through the resistor, the second switch, and the conductor in this order, and
    the reduction circuit, when all of the plurality of specific voltages are the output threshold or more, switches the second switch on.

6. The switch device according to claim 1, wherein the output voltage output by the output unit to the one end of the resistor is one of the plurality of specific voltages.

7. The switch device according to claim 1, wherein the output voltage output by the output unit to the one end of the resistor is different from the plurality of specific voltages.

8. The switch device according to claim 1, further comprising:
    a first circuit board; and
    a second circuit board different from the first circuit board,
    wherein the output unit is disposed on the first circuit board, and
    the switch, the resistor, the switching circuit, and the reduction circuit are disposed on the second circuit board.

* * * * *